United States Patent
Tsai et al.

(10) Patent No.: US 11,139,203 B2
(45) Date of Patent: Oct. 5, 2021

(54) USING MASK LAYERS TO FACILITATE THE FORMATION OF SELF-ALIGNED CONTACTS AND VIAS

(71) Applicant: Taiwan Semiconductor Manufacturing Co., Ltd., Hsin-Chu (TW)

(72) Inventors: Kuo-Chiang Tsai, Hsinchu (TW); Ke-Jing Yu, Kaohsiung (TW); Fu-Hsiang Su, Hsinchu (TW); Yi-Ju Chen, Tainan (TW); Jyh-Huei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/263,143

(22) Filed: Jan. 31, 2019

(65) Prior Publication Data
US 2020/0126857 A1    Apr. 23, 2020

Related U.S. Application Data

(60) Provisional application No. 62/748,579, filed on Oct. 22, 2018.

(51) Int. Cl.
| H01L 21/768 | (2006.01) |
| H01L 29/66 | (2006.01) |
| H01L 29/08 | (2006.01) |
| H01L 21/308 | (2006.01) |
| H01L 21/311 | (2006.01) |

(52) U.S. Cl.
CPC .... H01L 21/76897 (2013.01); H01L 21/3086 (2013.01); H01L 21/31144 (2013.01); H01L 21/76832 (2013.01); H01L 29/0847 (2013.01); H01L 29/66545 (2013.01)

(58) Field of Classification Search
CPC ......... H01L 21/28132; H01L 21/76831; H01L 21/76897
See application file for complete search history.

(56) References Cited

U.S. PATENT DOCUMENTS

| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |

(Continued)

FOREIGN PATENT DOCUMENTS

KR    20160047960    5/2016

*Primary Examiner* — Alia Sabur
(74) *Attorney, Agent, or Firm* — Haynes and Boone, LLP

(57) ABSTRACT

A source/drain region is disposed in a substrate. A gate structure is disposed over the substrate. A gate spacer is disposed on a sidewall of the gate structure. The gate spacer and the gate structure have substantially similar heights. A via is disposed over and electrically coupled to: the source/drain region or the gate structure. A mask layer is disposed over the gate spacer. The mask layer has a greater dielectric constant than the gate spacer. A first side of the mask layer is disposed adjacent to the via. A dielectric layer is disposed on a second side of the mask layer, wherein the mask layer is disposed between the dielectric layer and the via.

20 Claims, 30 Drawing Sheets

(56) References Cited

U.S. PATENT DOCUMENTS

| | | | |
|---|---|---|---|
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,362,170 B2 | 6/2016 | Basker et al. | |
| 9,431,296 B2 * | 8/2016 | Basker | H01L 21/76846 |
| 9,824,921 B1 * | 11/2017 | Labonte | H01L 21/76802 |
| 2012/0126295 A1 * | 5/2012 | Edge | H01L 29/66545 |
| | | | 257/288 |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0118303 A1 | 4/2016 | Kuo et al. | |
| 2017/0047257 A1 | 2/2017 | Han et al. | |
| 2017/0053997 A1 | 2/2017 | Cheng et al. | |
| 2017/0054004 A1 | 2/2017 | Cheng et al. | |
| 2017/0186849 A1 * | 6/2017 | Chen | H01L 29/6656 |
| 2017/0221757 A1 * | 8/2017 | Hsieh | H01L 29/41791 |
| 2018/0174904 A1 | 6/2018 | Hsieh et al. | |
| 2018/0286959 A1 | 10/2018 | Wang | |
| 2019/0164898 A1 * | 5/2019 | Zang | H01L 29/41791 |
| 2019/0181042 A1 * | 6/2019 | Xie | H01L 21/321 |

\* cited by examiner

USING MASK LAYERS TO FACILITATE THE FORMATION OF SELF-ALIGNED CONTACTS AND VIAS

PRIORITY DATA

This application is a utility application of Provisional U.S. Application No. 62/748,579, filed Oct. 22, 2018, the disclosure of which is herein incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. During the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, the existing processes for forming conductive contacts and/or vias for transistor components may have drawbacks, such as unintentional electrical shorting, high resistivity, excessive parasitic capacitance, etc. These drawbacks could degrade semiconductor device performance or even cause device failures.

Therefore, although existing semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
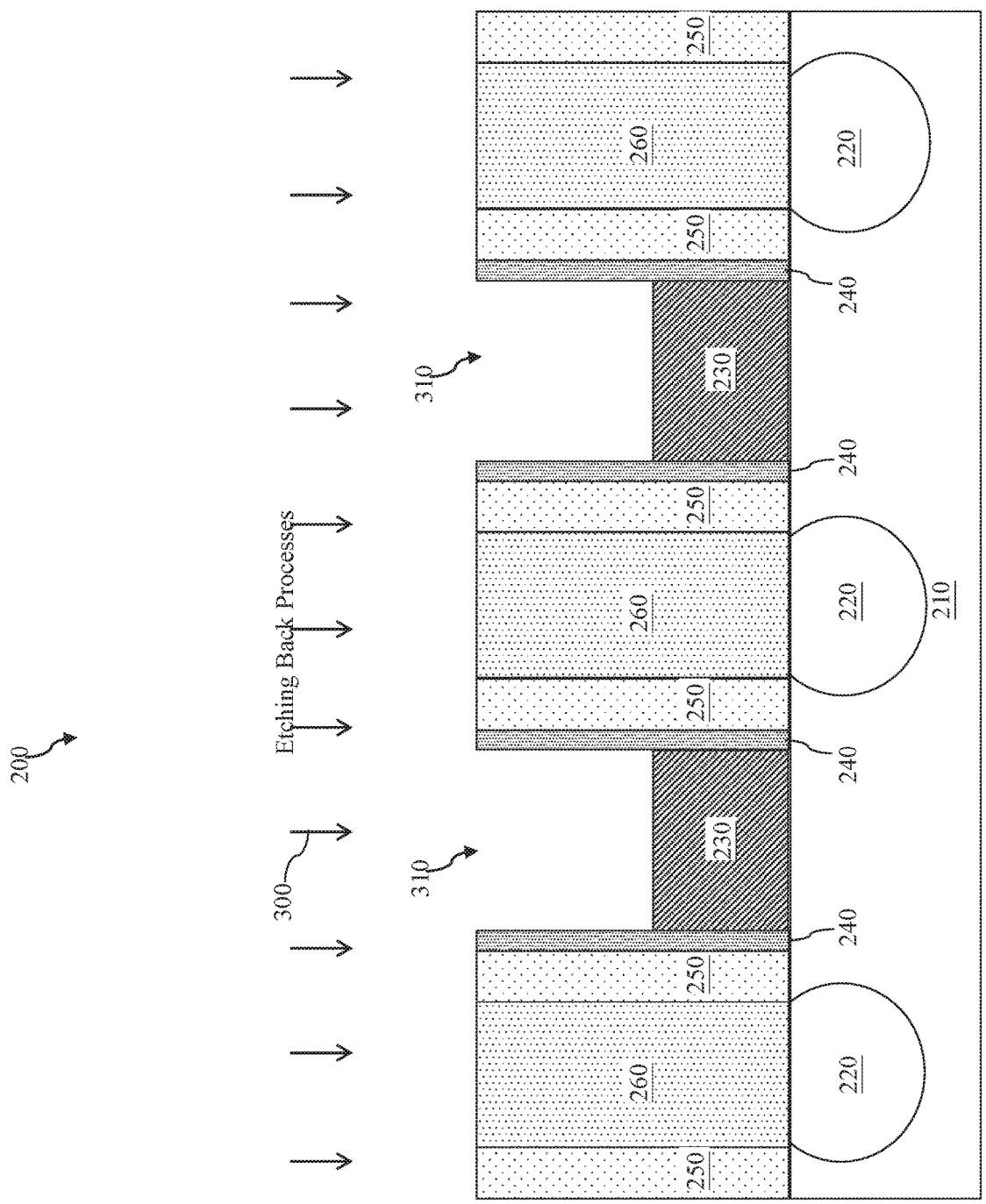
FIGS. 1-29 illustrate cross-sectional side views of a semiconductor device at various stages of fabrication according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As semiconductor technology nodes continue to shrink, challenges in fabrication arise. For example, middle end of line (MEOL) processes may refer to fabrication processes that form conductive contacts and vias for transistor components such as gate and/or source/drain components. However, existing MEOL processes have various shortcomings. Some existing MEOL processes may have shortcomings such as smaller source/drain contact sizes, high contact resistance, and/or stringent overlay control requirements. Other existing MEOL processes may have shortcomings such as high via resistance, excessive parasitic capacitance, and higher-than-desired gate height. These issues may become exacerbated as device scaling down continues and may degrade device performance. The present disclosure pertain to improved MEOL process flows that overcome the problems discussed above. The various aspects of the present disclosure will be discussed in more detail with reference to FIGS. 1-30.

FIGS. 1-30 are diagrammatic fragmentary cross-sectional side views of a semiconductor device 200 at various stages of fabrication in accordance with some embodiments. Referring now to FIG. 1, the semiconductor device 200 includes a substrate 210. The substrate 210 includes silicon in some embodiments. Alternatively or additionally, the substrate 210 may include other elementary semiconductors such as germanium. The substrate 210 may also include a compound semiconductor such as silicon carbide, gallium arsenic, indium arsenide, and indium phosphide. The substrate 210 may also include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). As examples, FIG. 1 illustrates a plurality of source/drain regions 220 formed in the substrate 210. The source/drain region 220 may include epitaxially grown materials and as such may also be referred to as epi-layers.

The substrate 210 may also include various electrical isolation regions. The electrical isolation regions provide electrical isolation between various device regions (such as the doped regions) in the substrate 210. The electrical isolation regions may include different structures formed by using different processing technologies. For example, the electrical isolation regions may include shallow trench isolation (STI) structures. The formation of an STI structure may include etching a trench in the substrate 210 and filling in the trench with one or more insulator materials such as silicon oxide, silicon nitride, silicon oxynitride, or combinations thereof. The filled trench may have a multi-layer structure such as a thermal oxide liner layer with silicon nitride filling the trench. A polishing or planarization process such as chemical mechanical polishing (CMP) may be performed to polish back excessive insulator materials and planarize the top surface of the isolation features.

The semiconductor device 200 includes a plurality of gate structures, for example gate structures 230 illustrated in FIG. 1. In some embodiments, the gate structures 230 are high-k metal gate structures—that is, the gate structures 230 each include a high-k gate dielectric and a metal gate electrode. In some embodiments, A high-k dielectric material is a material having a dielectric constant that is greater than a dielectric constant of $SiO_2$. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The metal gate electrode is formed over the high-k gate dielectric. In some embodiments, the metal gate electrode may include a work function metal component and a fill metal component. The work functional metal component is configured to tune a work function of its corresponding transistor to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the gate electrode. In various embodiments, the fill metal component may contain Aluminum (Al), Tungsten (W), Copper (Cu), or combinations thereof.

The gate structures 230 may be formed using a gate replacement process. In that regard, a dummy gate electrode (e.g., a polysilicon gate electrode) is formed first over the high-k gate dielectric. The source/drain regions (such as the source/drain regions 220-223) of the transistor are then formed in the substrate and on opposite sides of the dummy gate electrode. Thereafter, an interlayer dielectric (ILD) may be formed over the substrate and surrounds the dummy gate electrode therein. A polishing process such as chemical-mechanical-polishing (CMP) may be performed to planarize the upper surface of the ILD. The dummy gate electrode is then removed, leaving an opening in the ILD in place of the removed dummy gate electrode. The metal gate electrode is then formed in the opening. The above process may also be referred to as a gate-last process. In some other embodiments, the formation of the high-k metal gate structures may also involve a high-k last process, where a dummy gate dielectric (e.g., silicon oxide) is first formed, and the dummy gate electrode is formed over the dummy gate dielectric. After the formation of the source/drain regions and the ILD, both the dummy gate dielectric and the dummy gate electrode may be removed to form an opening in the ILD. The high-k gate dielectric and the metal gate electrode are then formed in the opening.

Gate spacers 240 are disposed on the sidewalls of the gate structures 230. In some embodiments, the gate spacers 240 include one or more low-k materials. In some embodiments, the low-k materials of the gate spacers may include one or more dielectric materials having a dielectric constant less than about 4. For example, the low-k materials may include silicon oxynitride (SiON), doped silicon, an oxide layer with nitrogen content, a nitride oxide, an oxide with hafnium content, or combinations thereof. Etching-stop layers 250 (ESL) are disposed on the sidewalls of the gate spacers 240. The etching-stop layers 250 are also referred to as bottom contact etching-stop layers (BCESL). The gate spacers 240 and the etching-stop layers 250 have different material compositions.

A dielectric layer 260 is disposed over each of the source/drain regions 220. The dielectric layer 260 has a different material composition than the gate spacers 240 and the etching-stop layers 250. In some embodiments, the dielectric layer 260 includes silicon oxide.

One or more etching back processes 300 is performed to the semiconductor device 200. The one or more etching back processes 300 remove a portion of each of the gate structures 230, thereby forming openings 310 in placed of the partially removed gate structures. A low-k dielectric material will be formed in the openings 310 in a later fabrication process, as discussed in more detail below.

Figure 2:
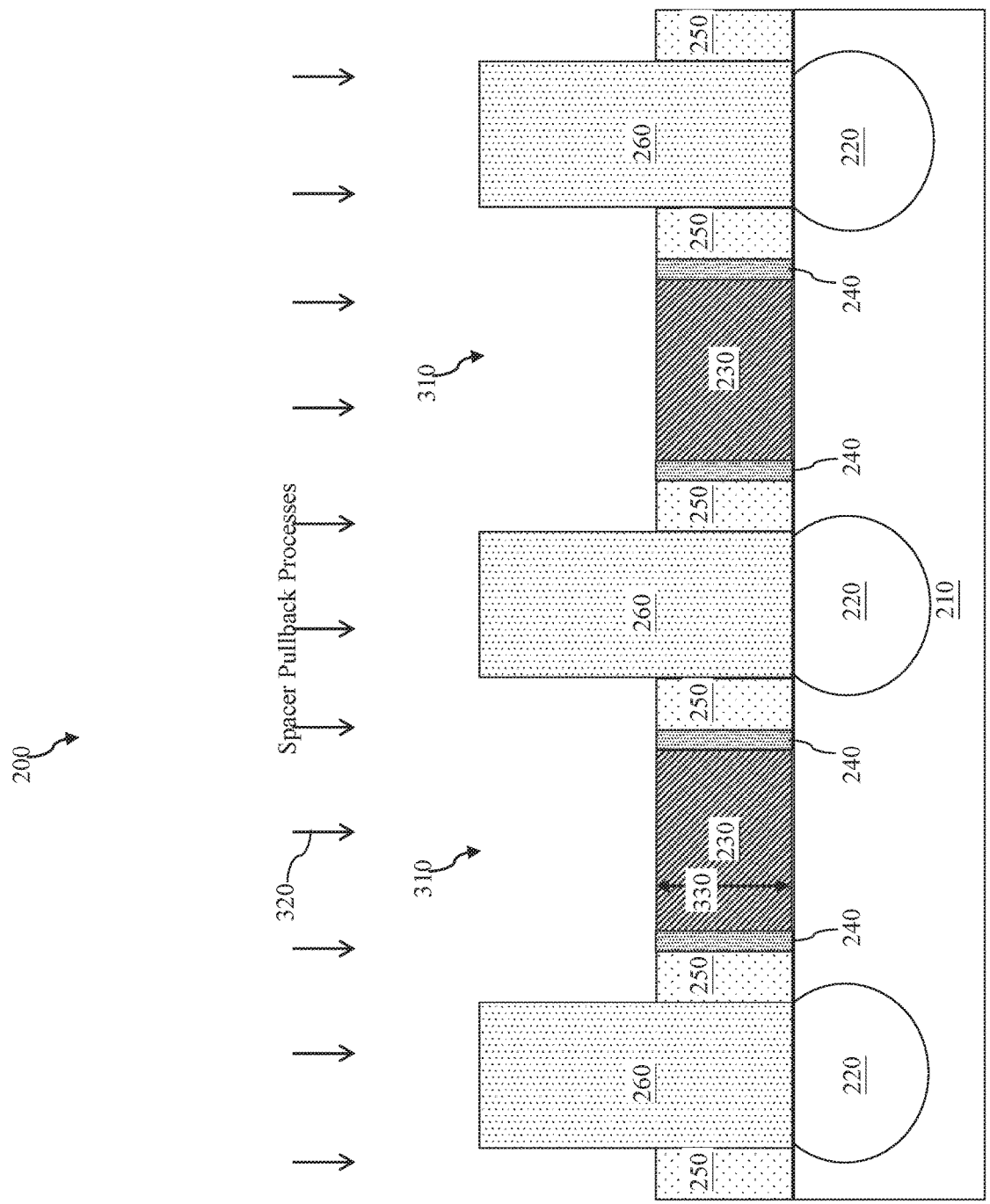

Referring now to FIG. 2, one or more spacer pullback processes 320 are performed to the semiconductor device 200. The one or more spacer pullback processes 320 remove the portions of the gate spacers 240 and the etching-stop layers 250 that are located above the gate structures 230. In some embodiments, the removal of the gate spacers 240 and the etching-stop layers 250 may be done by etching them laterally. After the one or more spacer pullback processes 320 are performed, the upper surfaces of the remaining portions of the gate spacers 240 and the etching-stop layers 250 may be substantially co-planar with the upper surfaces of the gate structures 230. In other words, the gate spacers 240, the etching-stop layers 250, and the gate structures 230 may have substantially similar heights, for example each within a few percentage points of a gate height 330.

Figure 3:
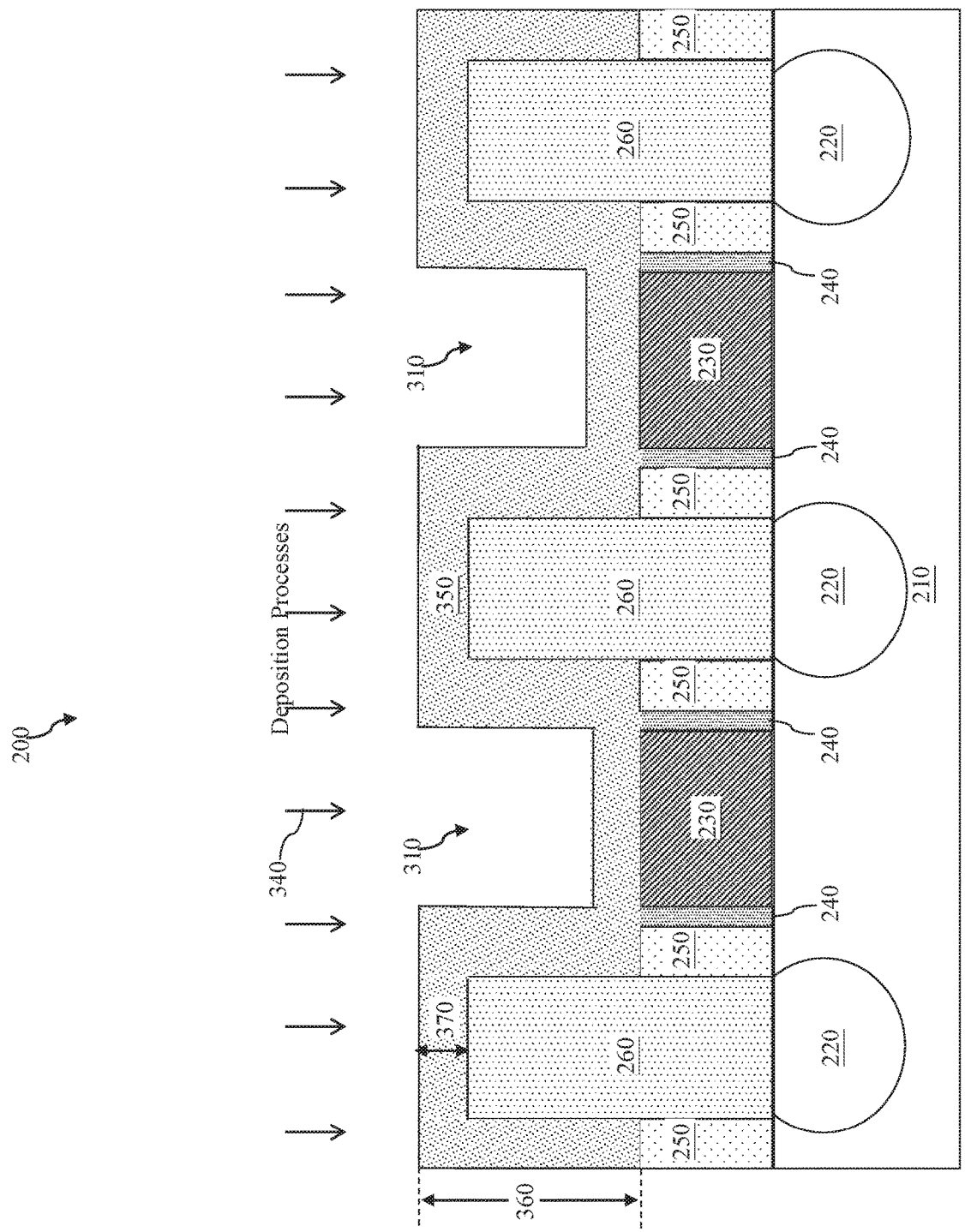

Referring now to FIG. 3, a deposition process 340 is performed to the semiconductor device 100 to form a mask layer 350. In some embodiments, the deposition process 340 includes a chemical vapor deposition (CVD) process, a physical vapor deposition (PVD) process, an atomic layer deposition (ALD) process, or combinations thereof. The mask layer 350 is formed over the gate structures 230, the gate spacers 240, the etching-stop layers 250, and the dielectric layers 260. The mask layer 350 partially fills the openings 310. As can be seen from FIG. 3, the mask layer 350 has a cross-sectional profile that resembles an antenna, in that the mask layer 350 zig-zags and has various peaks and valleys in the cross-sectional view. As such, the mask layer 350 may be referred to as an antenna-shaped mask layer as well.

The mask layer 350 has a different material composition than the gate spacers 240 and the etching-stop layers 250. In some embodiments, the mask layer 350 has a high-k dielectric material composition, for example a dielectric material with a dielectric constant that is greater than about 5. As non-limiting examples, the suitable materials for the mask layer 350 may include SiON, $Ta_2O_5$, $Al_2O_3$, $ZrO_2$, an oxide with aluminum content, an oxide with nitrogen content, an oxide with hafnium content, an oxide with tantalum content, an oxide with titanium content, an oxide with zirconium content, an oxide with aluminum content, an oxide with lanthanum content, nitrided oxide, or combinations thereof. Due to the relatively high dielectric constant of the mask layer 350 (e.g., higher than that of the gate spacers 240), the mask layer 350 is intentionally not formed on the sidewalls of the gate structures 230, since that would unnecessarily increase the parasitic capacitance of the semiconductor device 200. Instead, the gate spacers 240 (having a low-k dielectric constant) are located on the sidewalls of the gate structures 230. The high dielectric constant of the mask layer 350 does not adversely affect the parasitic capacitance too much herein because it is not located directly adjacent to the gate structure 230.

It is understood that the mask layer 350 may be implemented by a single layer or it may be implemented using multiple layers that each has its own unique dielectric material composition. The mask layer 350 may be used as a protective mask for the gate spacers 240 and the etching-stop layers 250, as discussed in more detail below.

The mask layer 350 has a height 360 measured from its bottommost surface and its topmost surface. In some embodiments, the height 360 is in a range between about 0.1 nanometers (nm) and about 50 nm. The mask layer 350 also has a thickness 370. In some embodiments, the thickness 370 is in a range between about 0.1 nm and about 15 nm. The ranges of the height 360 and/or the thickness 370 are configured to ensure that the mask layer 350 is thick enough to adequate serve as a protective layer, but not too thick to unnecessarily increase device height or otherwise interfere with the intended operations of the semiconductor device 200.

Figure 4:
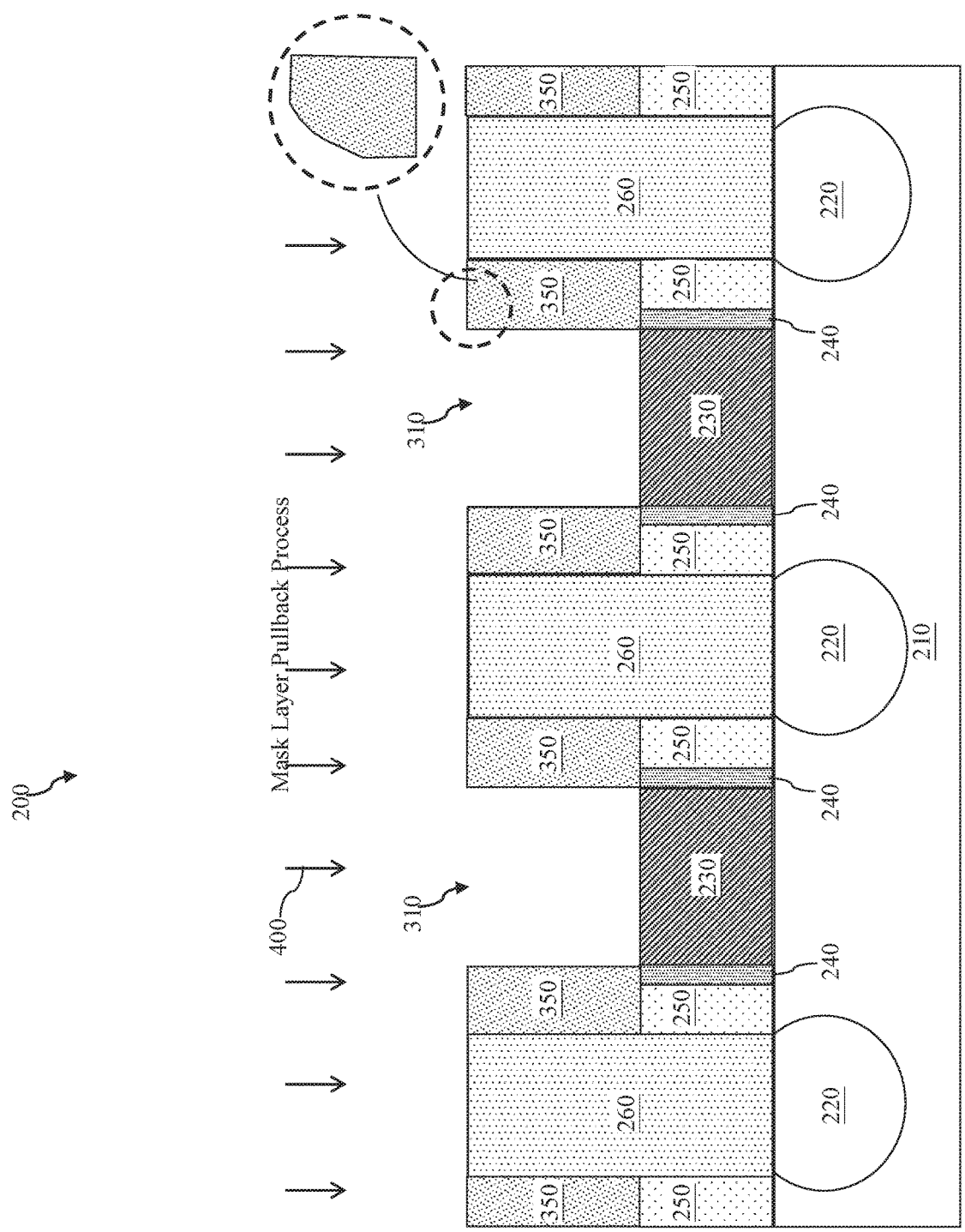

Referring now to FIG. 4, a mask layer pullback process 400 is performed to the semiconductor device 100. In some embodiments, the mask layer pullback process 400 includes one or more etching processes. The mask layer pullback process 400 removes portions of the mask layer 350 until the upper surfaces of the gate structures 230 and the dielectric layers 260 are exposed. At this point, the remaining portions of the mask layer 350 are disposed on the upper surfaces of the gate spacers 240 and the etching-stop layers 250, as well as on the sidewalls of the dielectric layers 260. Also note that, as a result of the mask layer pullback processes 400 being performed, the top corners of the remaining portions of the mask layer 350 may become rounded or curved, for example as shown in a magnified view corresponding to the dashed circles in FIG. 4. For reasons of simplicity, the curved or rounded corners or the mask layer 350 are not specifically illustrated in the ensuing figures.

Figure 5:
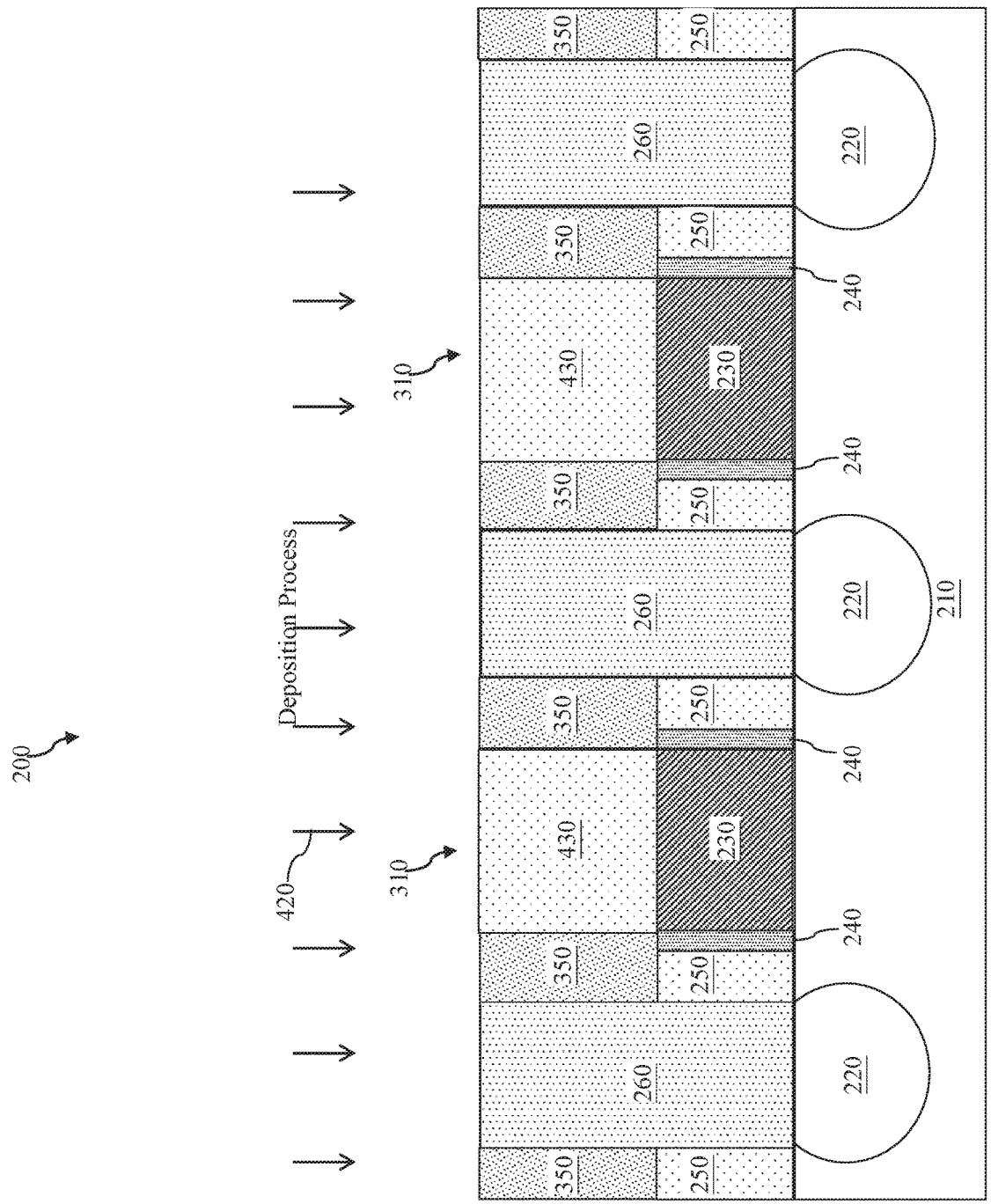

Referring now to FIG. 5, a deposition process 420 is performed to the semiconductor device 200. The deposition process 420 fills the openings 310 with a dielectric material 430. In some embodiments, the deposition process 420 may include a selective deposition, in which the dielectric material 430 is selectively deposited on the gate structures 230, but not on the dielectric layers 260 and not substantially on the mask layers 350.

The dielectric material 430 has a different material composition than the mask layer 350. In some embodiments, the dielectric material 430 includes a dielectric material having a dielectric constant that is less than that of a high-k dielectric material, but greater than that of a low-k dielectric material. In some embodiments, the dielectric material 430 has a dielectric constant less than about 10 but greater than about 4. As non-limiting examples, the low-k material may include silicon oxynitride (SiON), doped silicon, an oxide layer with nitrogen content, a nitride oxide, an oxide with hafnium content, or combinations thereof. In some embodiments, although the gate spacers 240 and the dielectric materials 430 both include low-k dielectric materials, they may still have different material compositions (e.g., different types of low-k dielectric materials). It is understood that some portions of the dielectric material 430 may remain in the final structure of the semiconductor device 200 and may serve as an inter-layer dielectric (ILD).

Figure 6:
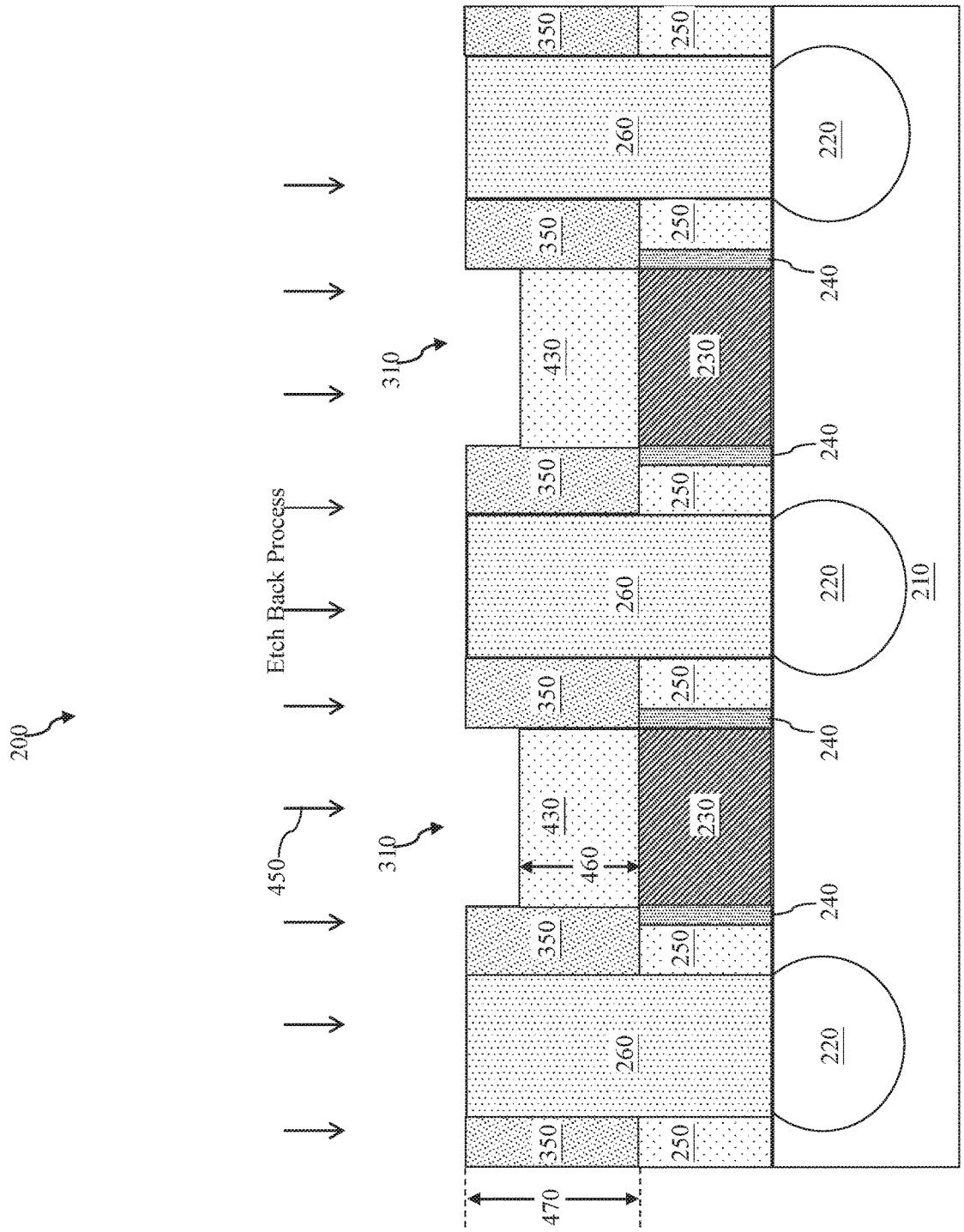

Referring now to FIG. 6, an etch back process 450 is performed to the semiconductor device 200. The etch back process 450 removes portions of the dielectric materials 430 without substantially removing the dielectric layers 260 or the mask layers 350. This may be achieved due to the differences in material compositions between these layers, so that an etching selectivity may be tuned to exist between them during the performance of the etch back process 450. After the performance of the etch back process 450, portions of the openings 310 re-emerge. In other words, a height 460 of the remaining portions of the dielectric materials 430 is less than a height 470 of the remaining portions of the mask layer 350 as a result of the etch back process 450 being performed. This is done so that a protective mask may be formed in the openings 310 over the remaining portions of the dielectric materials 430, as discussed below with reference to FIG. 7.

Figure 7:
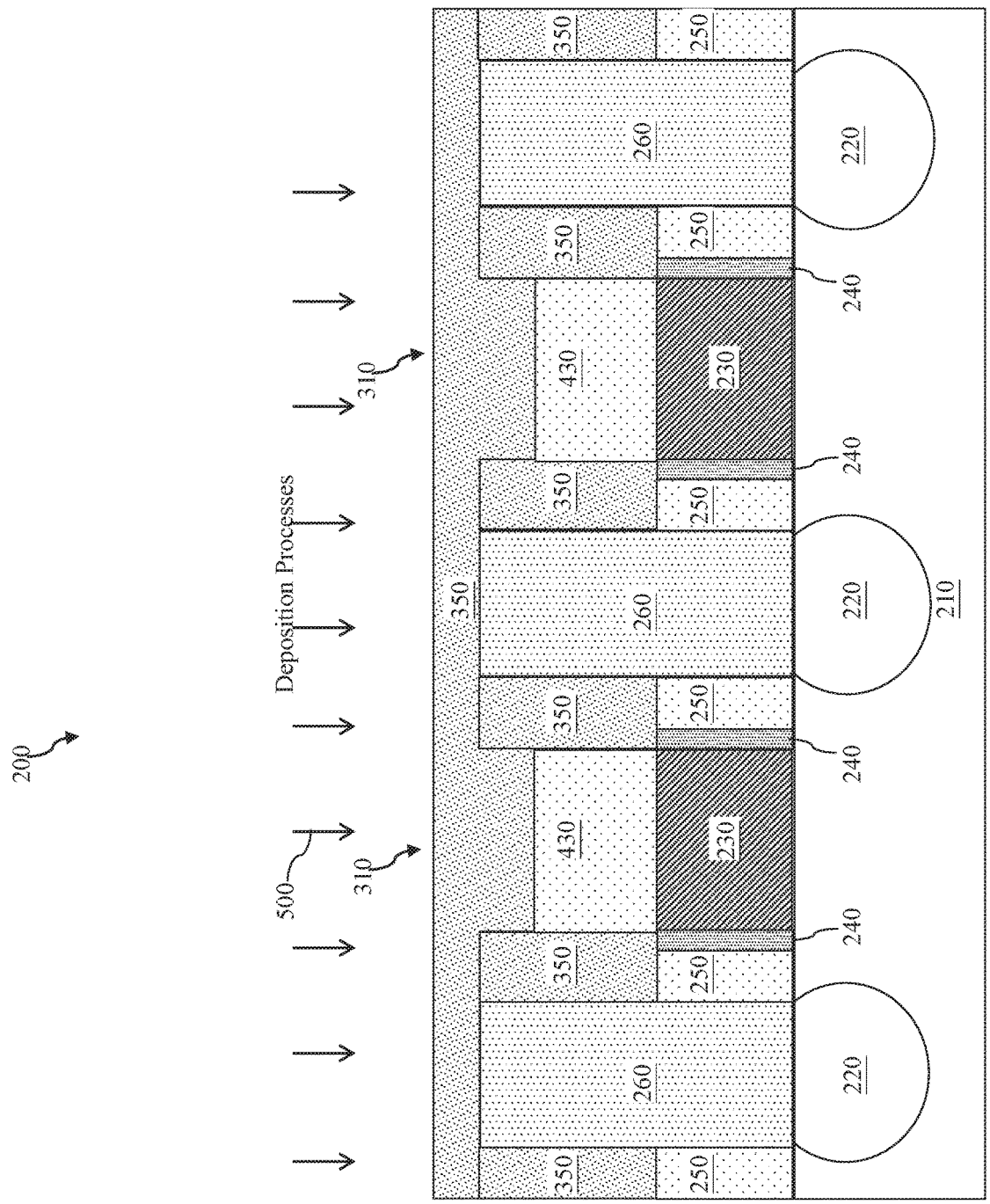

Referring now to FIG. 7, one or more deposition processes 500 are performed to the semiconductor device 200. The deposition processes 500 may be substantially similar to the deposition processes 340. In other words, the result of the deposition processes 500 is that additional portions of the mask layer 350 are formed, for example over the dielectric materials 430, the dielectric layers 260, and over existing portions of the mask layer 350. Portions of the mask layer 350 are formed directly above the dielectric materials 430 and may protect the dielectric materials 430 from etching in later processes.

Figure 8:
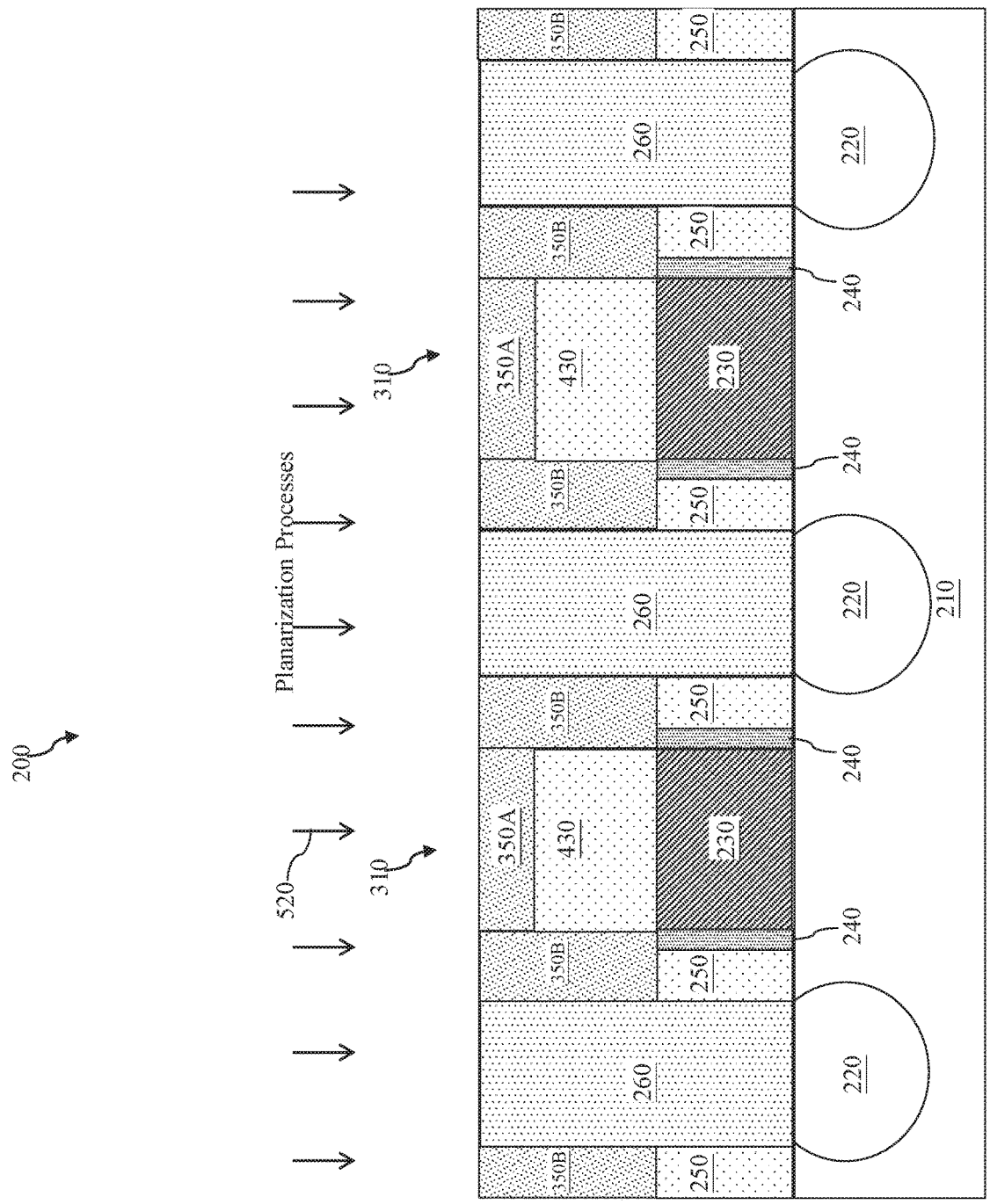

Referring now to FIG. 8, one or more planarization processes 520 are performed to the semiconductor device 200. In some embodiments, the one or more planarization processes 520 may include chemical mechanical polishing (CMP) processes. The planarization processes 520 remove portions of the mask layer 350 until the upper surfaces of the dielectric layer 260 are exposed. The planarization processes 520 "divides" the mask layer 350 into horizontal segments 350A and vertical segments 350B. The horizontal segments 350A are the segments disposed directly above the dielectric materials 430, and the vertical segments 350B are the segments disposed directly above the gate spacers 240 and the etching-stop layers 250 and on sidewalls of the dielectric layers 260. It can be seen that the vertical segments 350B and the horizontal segments 350A joining them together may collectively form a ⊓-like shape at this stage of fabrication.

Figure 9:
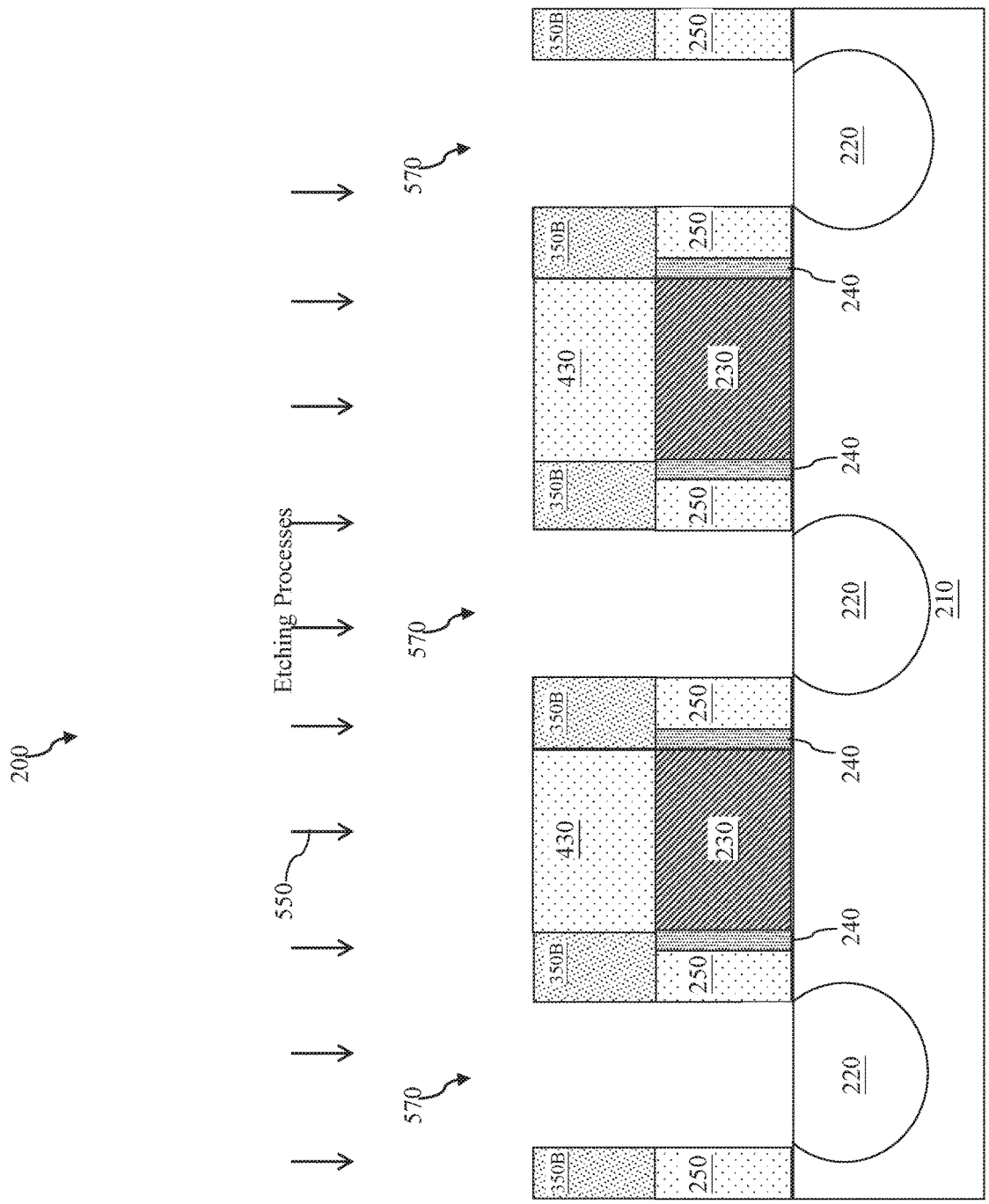

Referring now to FIG. 9, one or more etching processes 550 are performed to the semiconductor device 200. The one or more etching processes 550 remove the dielectric layers 260 until the upper surfaces of the source/drain regions 220 are exposed. Due to the differences in material compositions between the dielectric layers 260 and the mask layer segments 350A and 350B, the one or more etching processes 550 may be tuned to have etching selectivity between the dielectric layers 260 and the mask layer segments 350A and 350B. That is, the dielectric layers 260 may be etched away at a substantially greater rate (e.g., 10 times or more) than the mask layer segments 350A and 350B. As such, the mask layer segments 350A and 350B are considered etching-resistant during the etching processes 550. This allows the mask layer segments 350B to serve as protective masks to protect the dielectric materials 430 disposed therebelow during the performance of the etching processes 550, and the mask layer segments 350A to serve as protective masks to protect the gate spacers 240 and the etching-stop layers 250 therebelow during the performance of the etching processes 550.

In some embodiments (such as the illustrated embodiment), the etching processes 550 may also lead to a substantial removal of the horizontal segments 350A, such that the upper surfaces of the dielectric materials 430 may become exposed. In other embodiments, the removal of the horizontal segments 350A may not be complete, and as such as small portion of the horizontal segments 350A may still remain on the dielectric materials 430. Regardless of whether the removal of the horizontal segments 350A is complete, they still served the function of protecting the dielectric materials 430 during the etching processes 550. At this stage of fabrication, the vertical segments 350B and the dielectric materials 430 have substantially similar heights. Stated differently, they may have substantially co-planar upper surfaces at this stage.

The removal of the dielectric layers 260 forms openings 570 in place of the removed dielectric layers 260. The openings 570 are reserved for the formation of conductive contacts of some of the source/drain regions 220. It may be said that the openings 570 are self-aligned (e.g., aligned with the source/drain regions 220) due to the mask layer segments 350A and 350B.

Figure 10:
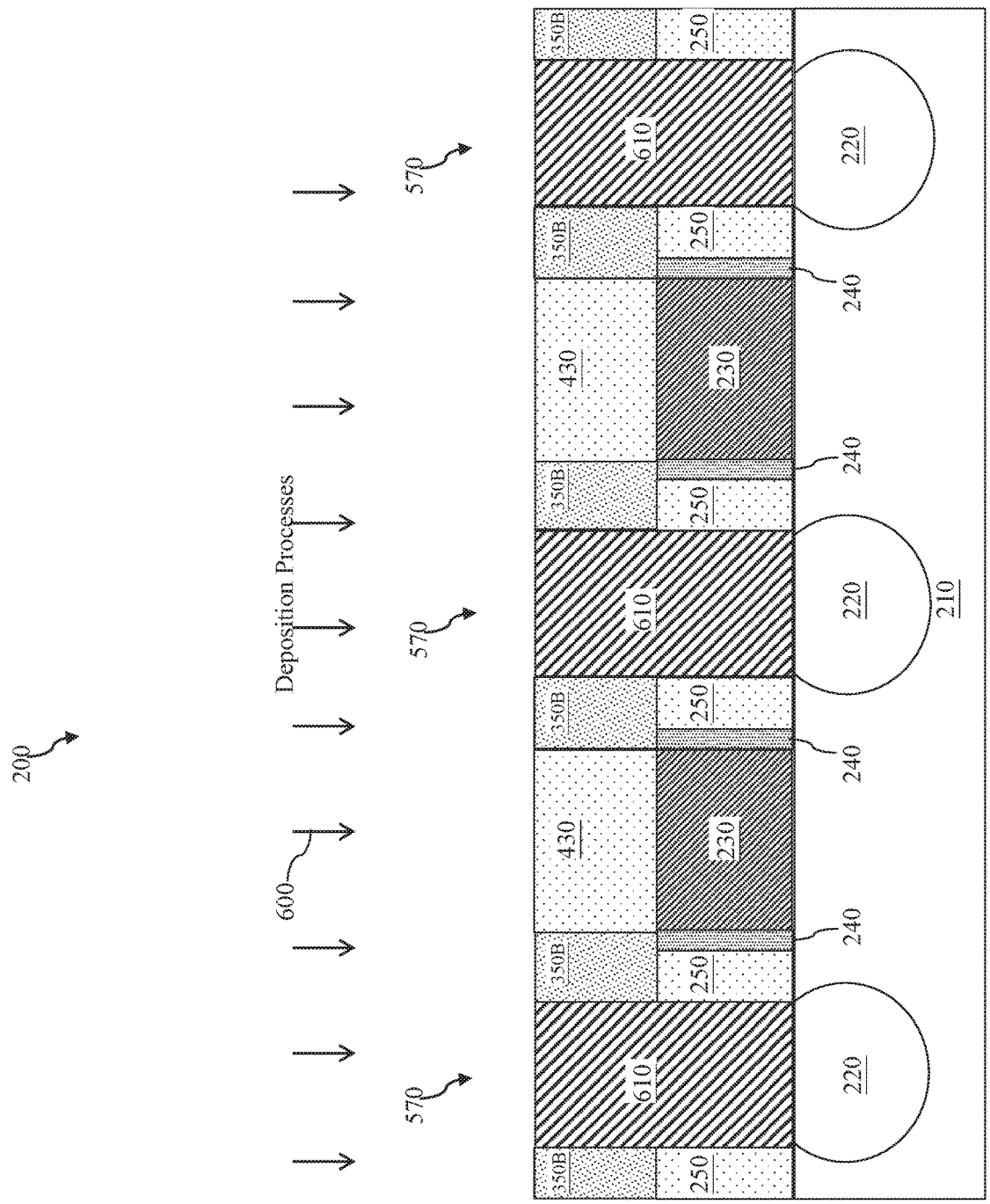

Referring now to FIG. 10, one or more deposition processes 600 are performed to the semiconductor device 200. The one or more deposition processes 600 form conductive contacts 610 (also referred to as MD contacts) in the openings 570. The deposition processes 600 may include CVD, PVD, ALD, or combinations thereof. It is understood that a polishing process may be performed following the deposition processes 600 to planarize the surfaces of the conductive contacts 610. In some embodiments, the conductive contacts 610 contain a metal or metal compound material, for example tungsten, aluminum, copper, or compounds thereof, etc. The conductive contacts 610 provide electrical connectivity to the source/drain regions 220.

Figure 11:
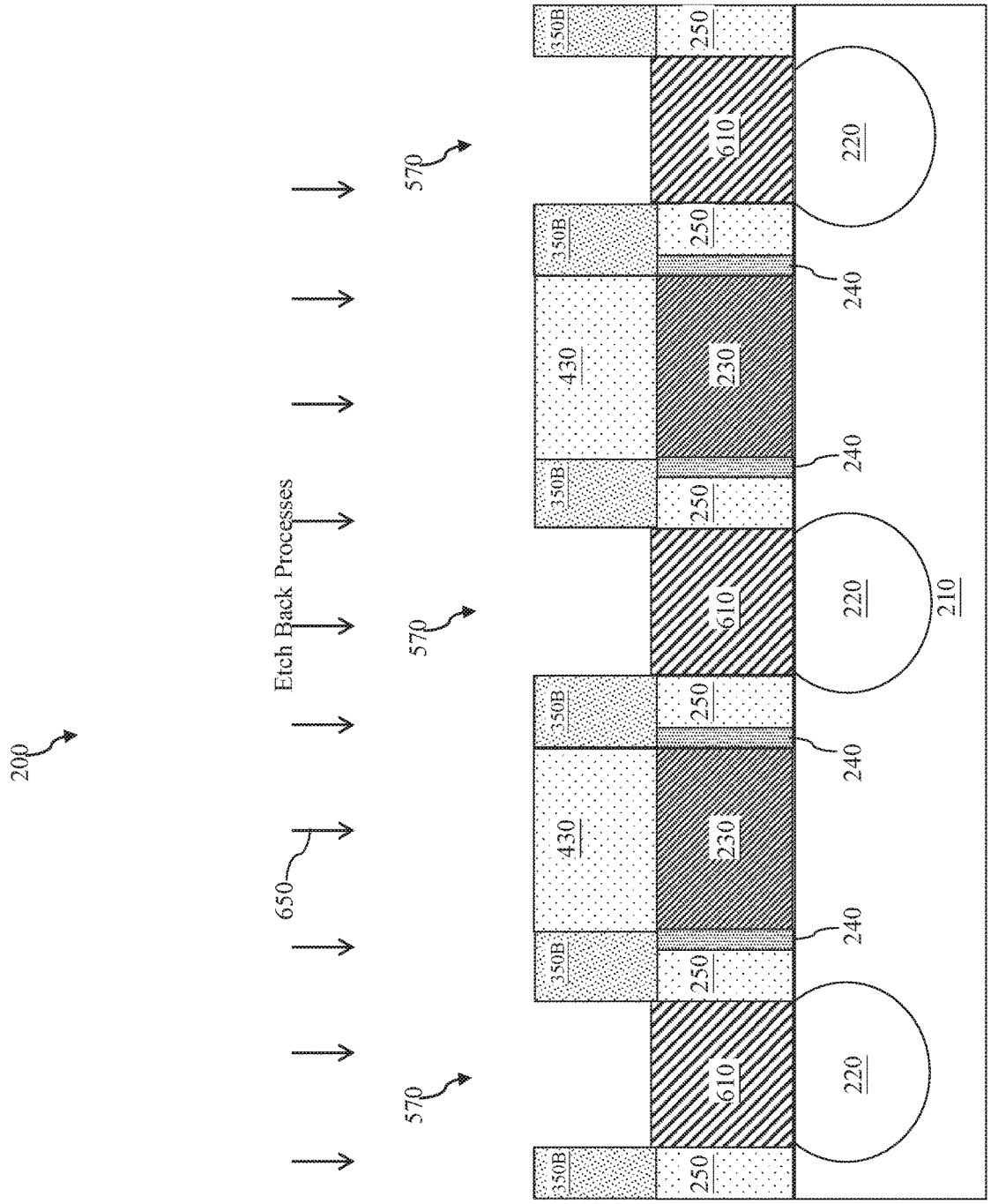

Referring now to FIG. 11, one or more etch back processes 650 are performed to the semiconductor device 200. The one or more etch back processes 650 etches back the conductive contacts 610 (e.g., partially removes them). Portions of the openings 570 re-emerge due to the partial removal of the conductive contacts 610.

Figure 12:
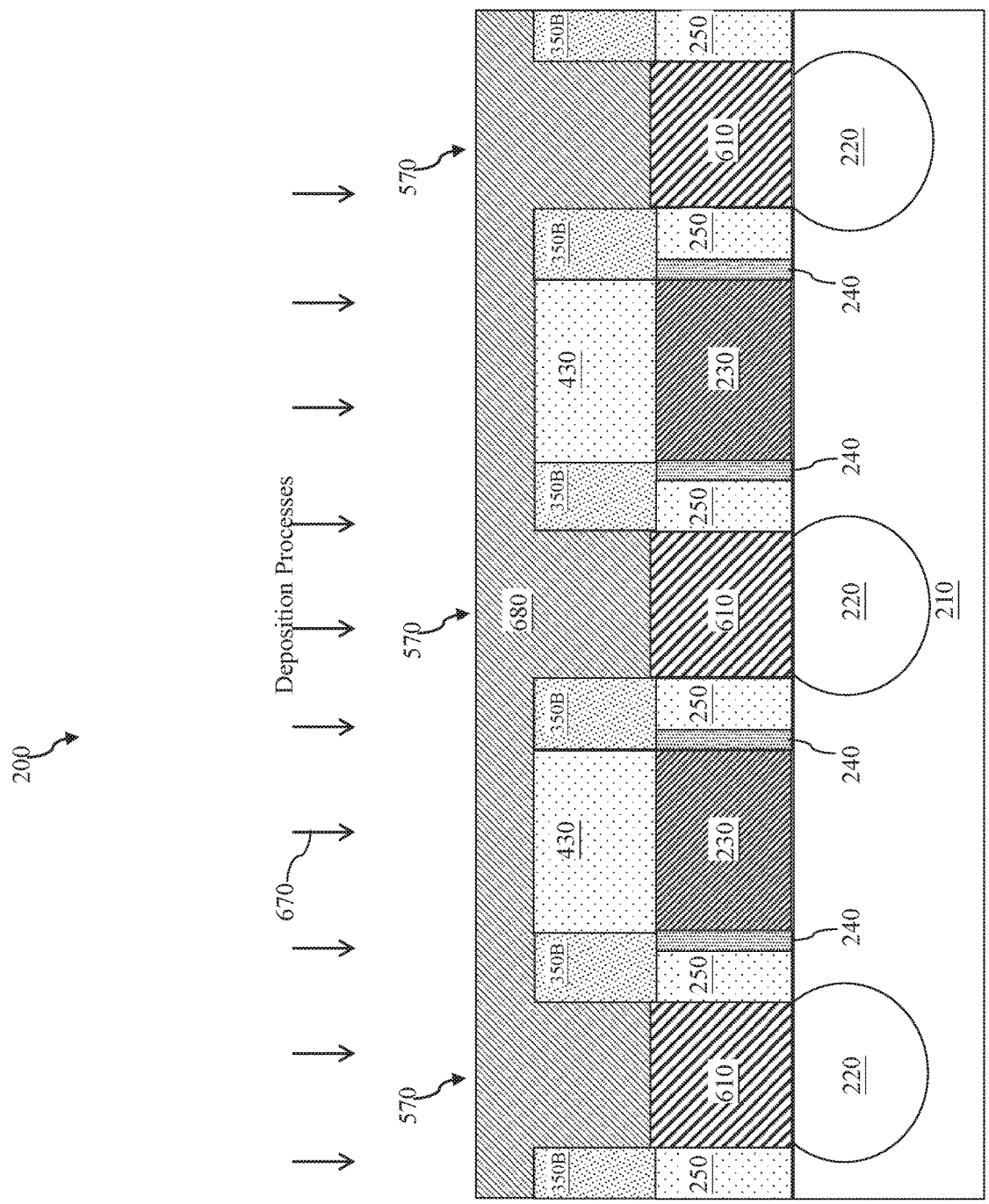

Referring now to FIG. 12, one or more deposition processes 670 are performed to the semiconductor device 200. The one or more deposition processes 670 form another etching-stop layer 680 (also referred to as a middle contact etching-stop layer, or MCESL) on the semiconductor device 200, for example on the dielectric materials 430, on the mask layer segments 350B, and on the conductive contacts 610. The etching-stop layer 680 also completely fill the openings 570. The etching-stop layer 680 includes a dielectric material. In some embodiments, the etching-stop layer 680 may have a different material composition than the mask layers 350 and/or a different material composition than the gate spacers 240.

Figure 13:
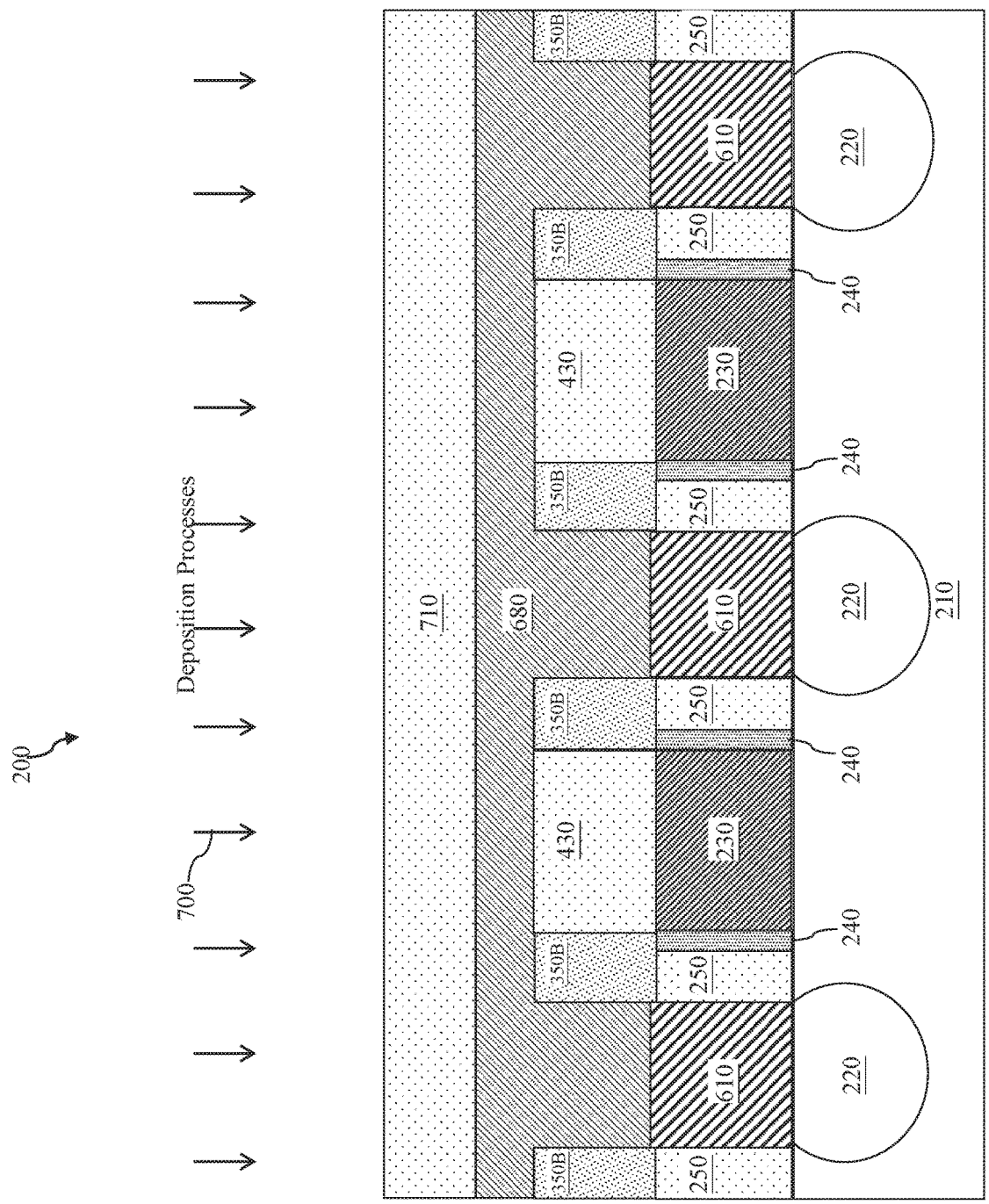

Referring now to FIG. 13, one or more deposition processes 700 are performed to the semiconductor device 200. The one or more deposition processes 700 form an interlayer dielectric (ILD) layer 710. The ILD layer 710 may include a low-k dielectric material, for example a carbon-containing oxide, or a fluorine-containing oxide, or combinations thereof. In some embodiments, the dielectric constant of the low-k dielectric material for the ILD layer 710 is less than about 4. The low-k dielectric material helps to reduce the parasitic capacitance of the semiconductor device 200.

Figure 14:
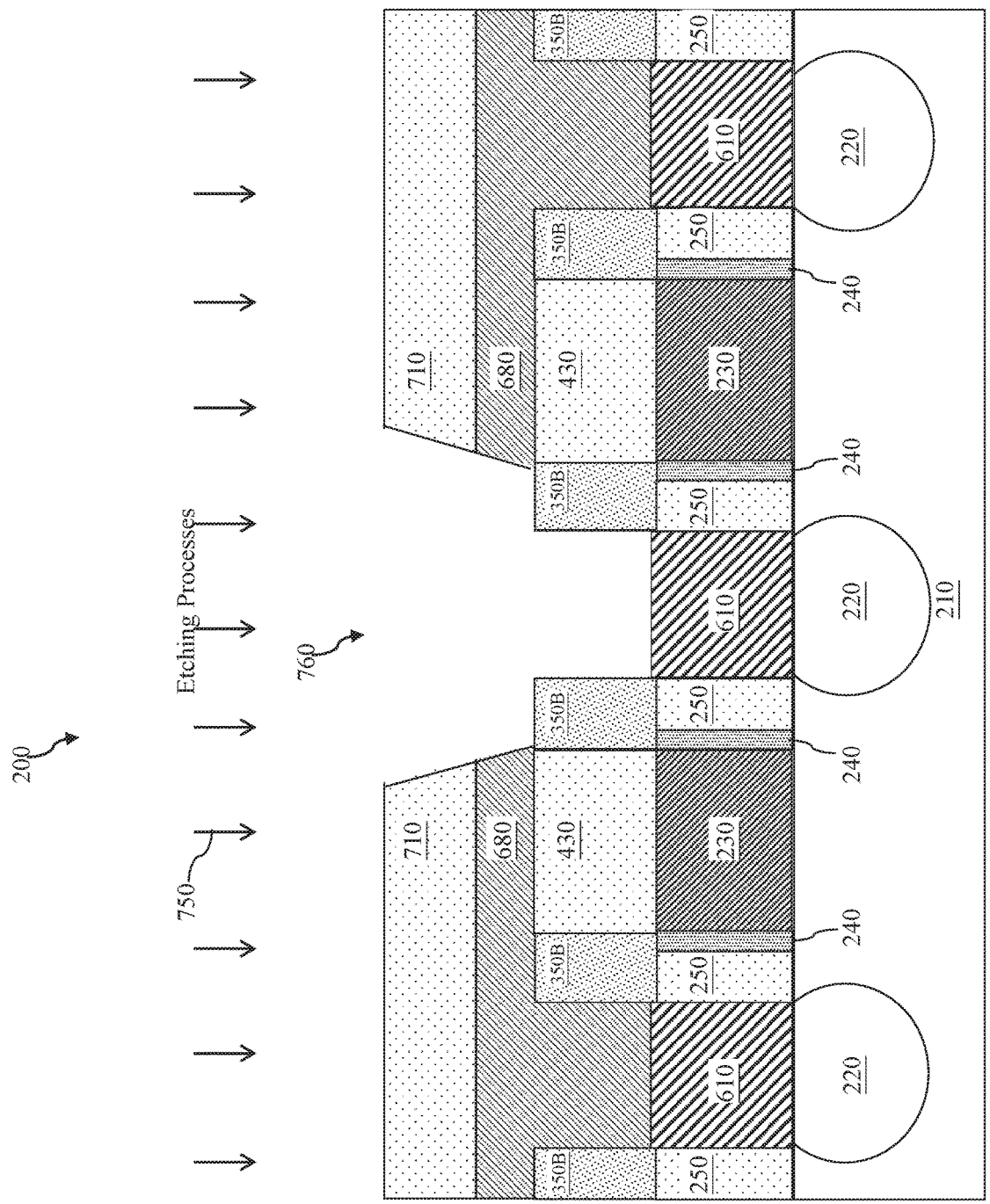

Referring now to FIG. 14, one or more etching processes 750 are performed to the semiconductor device 200. The one or more etching processes 750 form an opening 760 that extends vertically through the ILD layer 710 and the etching-stop layer 680. The opening 760 is aligned with one of the conductive contacts 610, and thus the partial removal of the ILD layer 710 and the etching-stop layer 680 exposes the conductive contact 610. Due to the differences in material composition between the mask layer segments 350B and the etching-stop layer 680 and the ILD layer 710, the etching processes 750 has etching selectivity between the mask layer segments 350B and the etching-stop layer 680 and the ILD layer 710. That is, the etching-stop layer 680 and the ILD layer 710 are removed at substantially faster etching rates (e.g., 10 times or greater) than the mask layer segments 350B. In this manner, the mask layer segments 350B can protect the gate spacers 240 and the etching-stop layers 250 therebelow during the etching processes 750.

The mask layer segments 350B also facilitate self-alignment (e.g., aligned with the conductive contacts 610) of the opening 760. In more detail, an overlay shift during the etching processes 750 may cause the opening 760 to shift to the "right" or "left" in the cross-sectional view. Had the mask layer segments 350B not been formed, such an overlay shift may inadvertently etch away portions of the dielectric materials 430 disposed above the gate structures 230. In other words, poor overlay control may inadvertently expose the gate structures 230 to the opening 760. The opening 760 is reserved for the formation of a source/drain via that will be electrically coupled to the conductive contact 610. If the gate structures 230 are exposed, then the source/drain via eventually formed will also be formed to be in physical contact with the gate structures 230, not just the conductive contact 610. As such, the gate structures 230 would be electrically shorted to the source/drain via filling the opening 760. This unintentional electrical shorting may be referred to as "electrical leakage", and it is undesirable since it could degrade semiconductor performance or even lead to failures.

Here, the implementation of the mask layer segments 350B is configured to be etching-resistant during the etching processes 750. Thus, even if some overlay shift occurs, the mask layer segments 350B can still adequately prevent the shifted opening 760 from inadvertently exposing the gate structures 230. Thus, the source/drain via formed in the opening 760 is electrically coupled to the conductive contact 610 but not to the gate structure 230. In this manner, the mask layer segments 350B promote the self-alignment of the opening 760 (and consequently the self-alignment of the source/drain via) with the intended target—the conductive contact 610.

The use of the mask layer segments 350B to facilitate the formation of the opening 760 also allows the semiconductor device 200 to achieve a smaller height. In more detail, some conventional semiconductor fabrication process flows require an extra mask layer to define the source/drain and/or gate contact/via openings. Etching-stop layers similar to the etching-stop layer 680 may then be formed on top of the extra mask layer. As a result, the effective height of the semiconductor device may be tall. In addition, the vias/contacts formed by these conventional processes may also need to vertically extend through the extra mask layers, which means that the vias/contacts may also be taller than necessary. Among other things, the taller vias/contacts lead to higher via/contact resistivity. In comparison, the mask layer 350 (or its segments 350A and 350B) of the present disclosure do not require an extra layer but rather occupies the same layer as the etching-stop layer 680. Therefore, the effective gate height and via/contact height may be reduced, leading to a lower resistivity.

Figure 15:
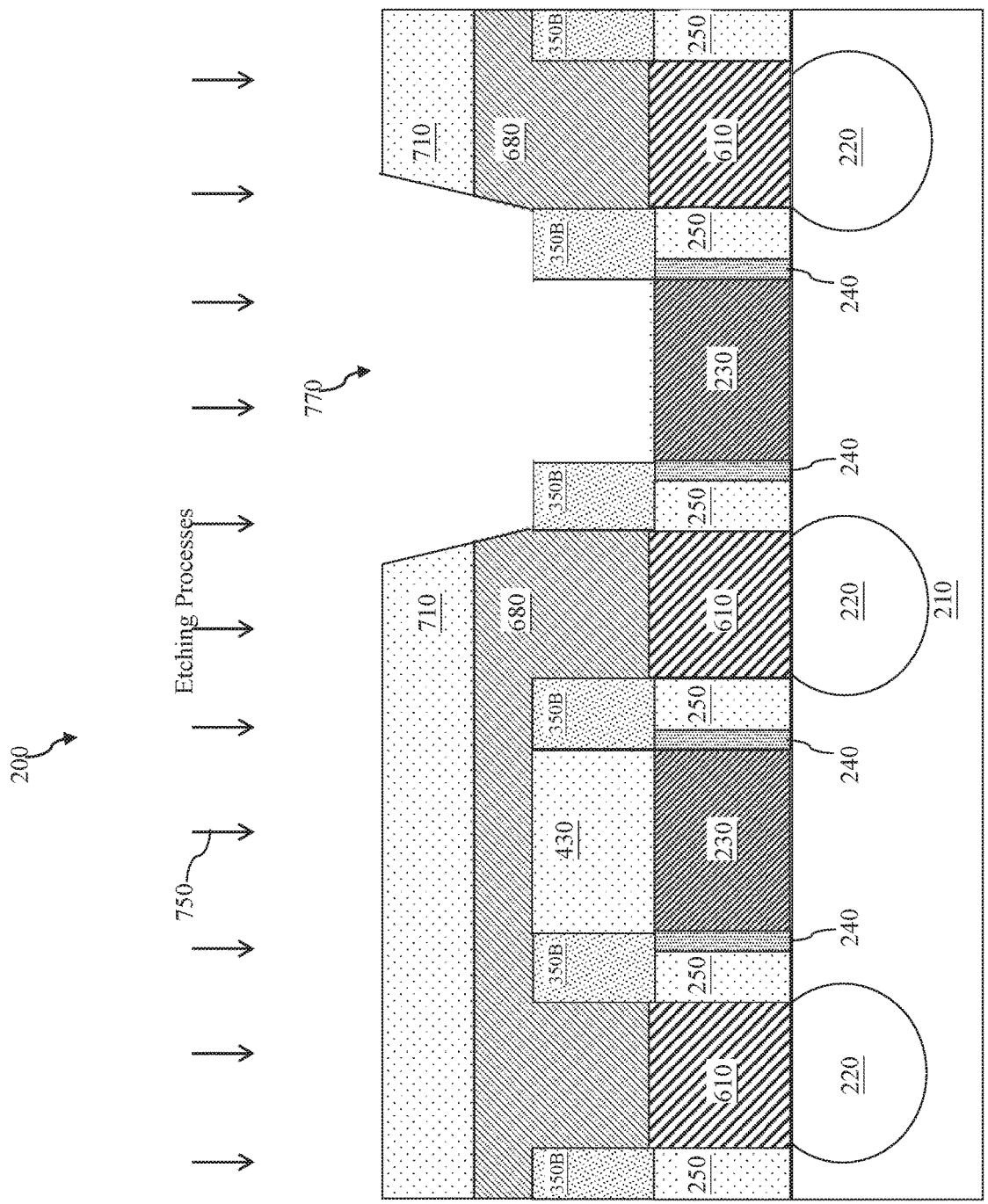

It is understood that the one or more etching processes 750 may also form one or more openings that are aligned with one or more of the gate structures 230. Due to space constraints in the drawings, such openings are not illustrated in FIG. 14, but a non-limiting example one of such openings is shown in FIG. 15. Referring to FIG. 15, the opening 770 also vertically extends through the ILD layer 710 and the etching-stop layer 680 and exposes one of the gate structures 230.

For reasons similar to that discussed above with reference to the opening 760, the opening 770 is also self-aligned with the gate structure 230 due to the presence of the mask layer segments 350B. For example, the opening 770 is reserved for the formation of a conductive via (or contact) for the gate structure 230. The conductive via/contact for the gate structure 230 is less likely to be electrically shorted to the conductive contact 610 even if poor overlay control causes the opening 770 to shift laterally. This is because the etching-resistant mask layer segments 350B can effectively prevent the etching processes 750 from over-etching. As such, the mask layer segments 350B promotes the self-alignment of the opening 770 (and consequently the self-alignment of the source/drain via) with the intended target—the gate structure 230.

Figure 16:
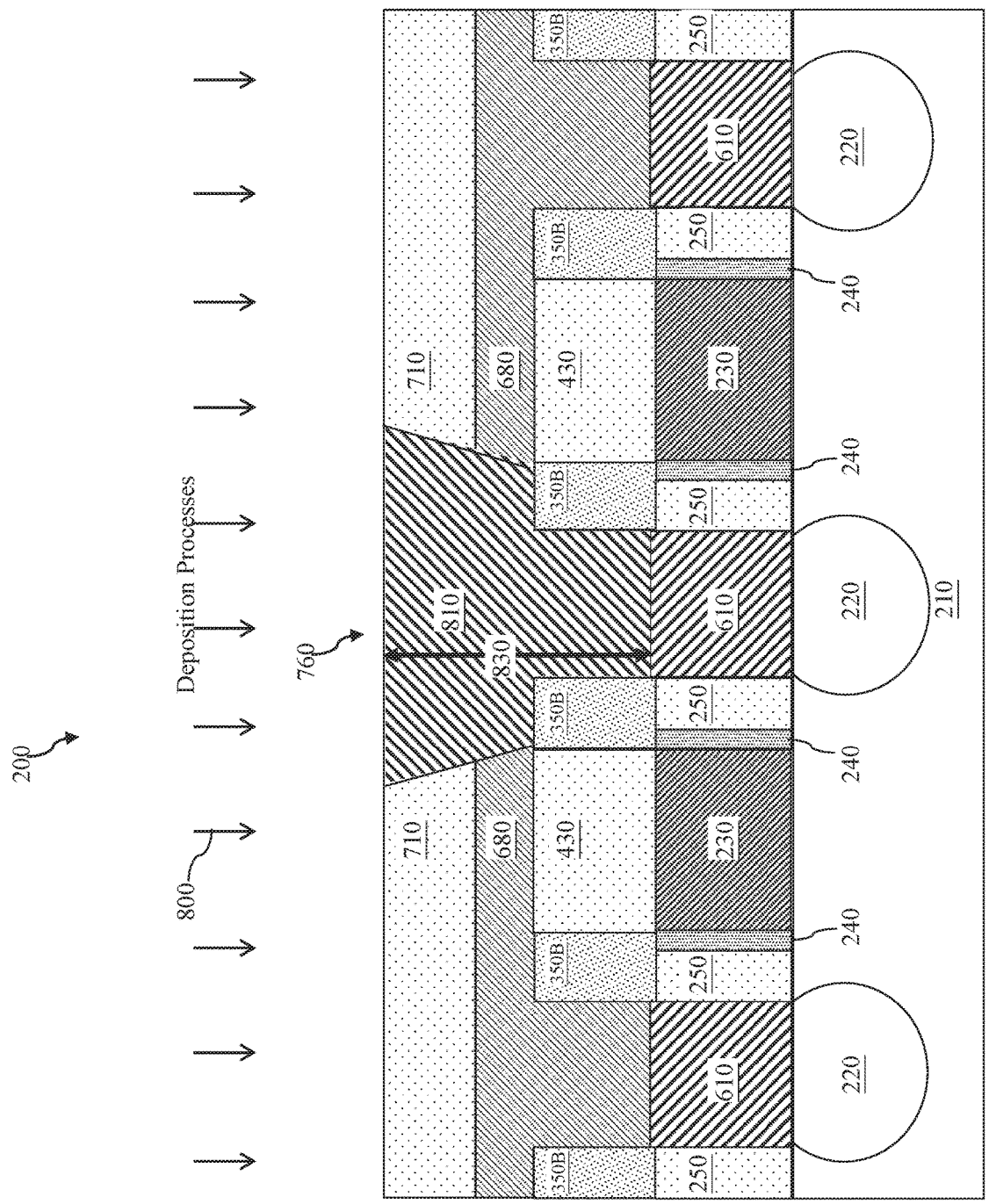
Figure 17:
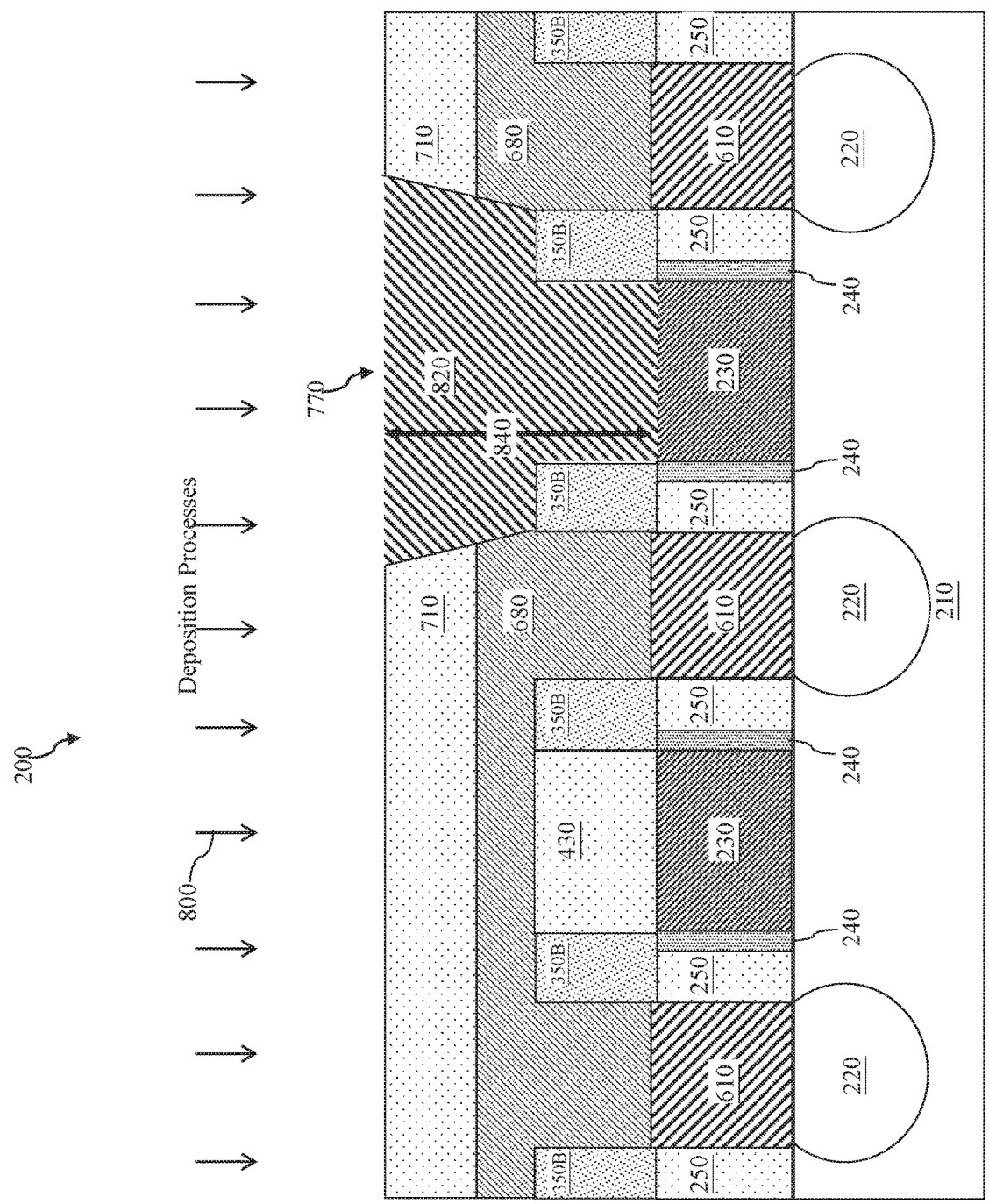

Referring now to FIGS. 16 and 17, one or more deposition processes 800 are performed to the semiconductor device 200. The one or more deposition processes 800 fill the opening 760 and/or the opening 770 with a conductive material. A planarization process such as a CMP process may be performed to the deposited conductive material. As a result, a via 810 may be formed in the opening 760 as shown in FIG. 16, and/or a via 820 may be formed in the opening 770 as shown in FIG. 17. The via 810 provides electrical connectivity to the source/drain 220 and may be referred to as a VD via, and the via 820 provides electrical connectivity to the gate structure 230 and may be referred to as a VG via. As discussed above, the present disclosure advantageously ensures that the via 810 is self-aligned with the conductive contact 610 and is less likely to be electrically shorted to the gate structures 230, and that the via 820 is self-aligned with the gate structure 230 and is less likely to be electrically shorted to the conductive contact 610.

The mask layer segments 350B are disposed adjacent to the via 810. In some embodiments, the mask layer segments 350B may be in direct physical contact with sidewalls (e.g., lower portions of the sidewalls) of the via 810. In other embodiments, the overlay control is sufficiently tight, and the via 810 is formed to be sufficiently small, such that a small amount of the dielectric material 430 may still remain between the mask layer segments 350B and the via 810. The same is true for the mask layer segments 350B and the via 820. Also as shown in FIG. 16, while a first side of each mask layer segment 350B is disposed adjacent to the via 810 (e.g., facing the via), a second and opposite side of each mask layer segment 350B is disposed adjacent to the dielectric material 430 (e.g., facing the dielectric material 430). In the case of the via 820 in FIG. 17, a first side of each mask layer segment 350B is disposed adjacent to the via 820, while a second and opposite side of each mask layer segment 350B is disposed adjacent to the etching-stop layer 680.

As a result of the fabrication process flow discussed above being performed, another unique characteristic of the semiconductor device 100 is that the via 810 and via 820 have similar heights. As shown in FIG. 16, the via 810 has a height 830, and the via 820 has a height 840. The height 830 and 840 should be similar in value. In some embodiments, a ratio between the height 830 and the height 840 is in a range from about 0.9:1 and about 1.1:1 In some embodiments, the height 830 and the height 840 are each in a range between about 5 nm and about 45 nm. One reason for the similarity in the height 830 and the height 840 is that the via 810 and the via 820 each extend through the same layers—the layers 680 and 710. Thus, the differences between the height 830 and the height 840 is mostly attributed to the differences in height between the conductive contact 610 and the gate structure 230 before the vias 810 and 820 are formed. In comparison, conventional fabrication process flows may lead to drastically different heights between source/drain vias and gate vias.

FIGS. 1-17 illustrate the process flow according a first embodiment of the present disclosure. FIGS. 18-22 illustrate a second embodiment of the present disclosure. For reasons of consistency and clarity, similar processes or components appearing in both the first embodiment and the second embodiment are labeled the same.

Figure 18:
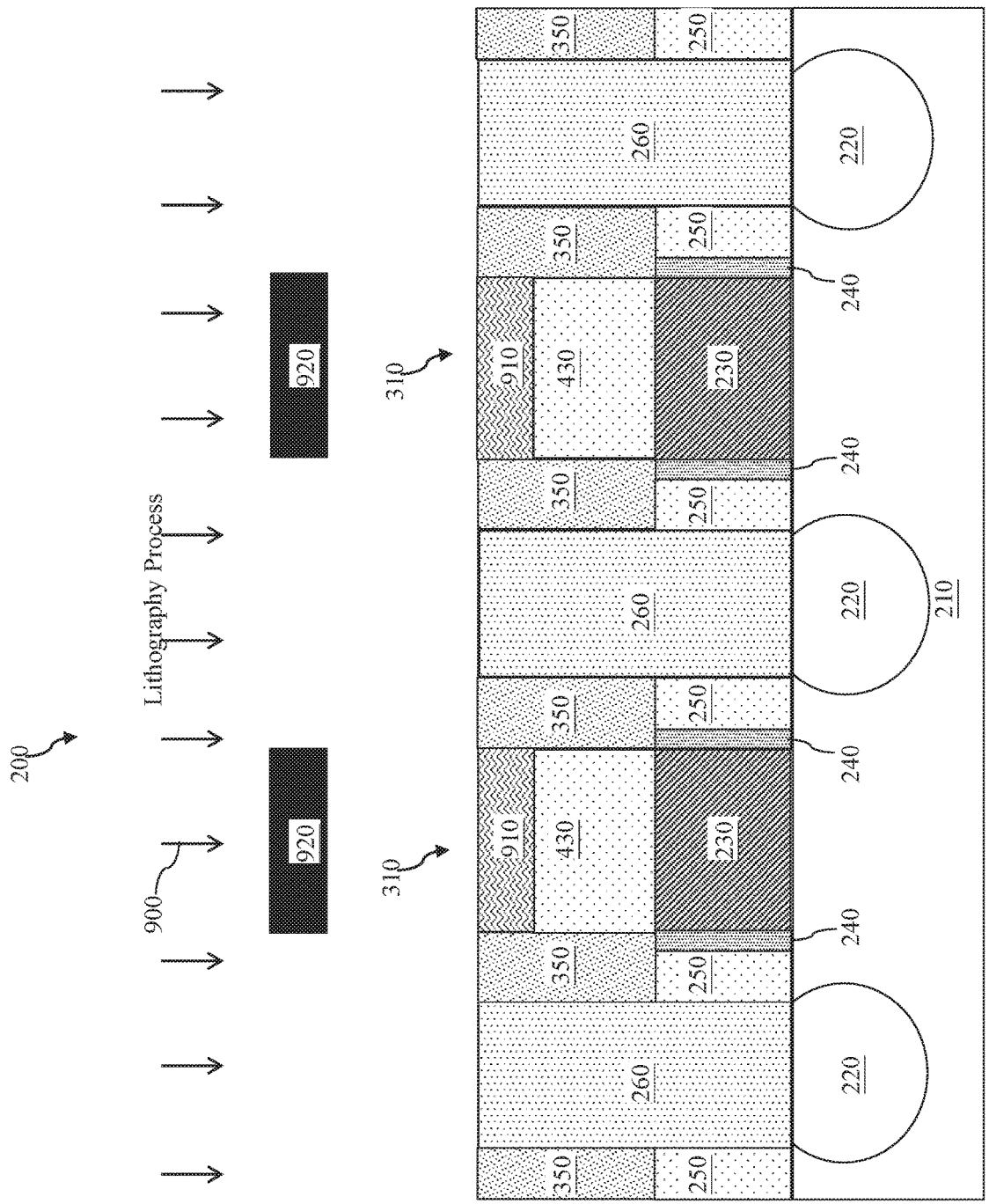

Referring now to FIG. 18, the semiconductor device 200 has undergone the same processing steps discussed above with reference to FIGS. 1-6. Openings 310 have re-emerged due to the etching back of the dielectric materials 430. A lithography process 900 is performed to the semiconductor device 200 to form photoresist layers 910 in the openings 310. The photoresist layers 910 may be defined by reticles 920 as a part of the lithography process 900. The photoresist layers 910 serve a similar purpose as the mask layer segments 350A discussed above in association with the first embodiment, which is to protect the dielectric materials 430 below in etching processes subsequently performed.

Figure 19:
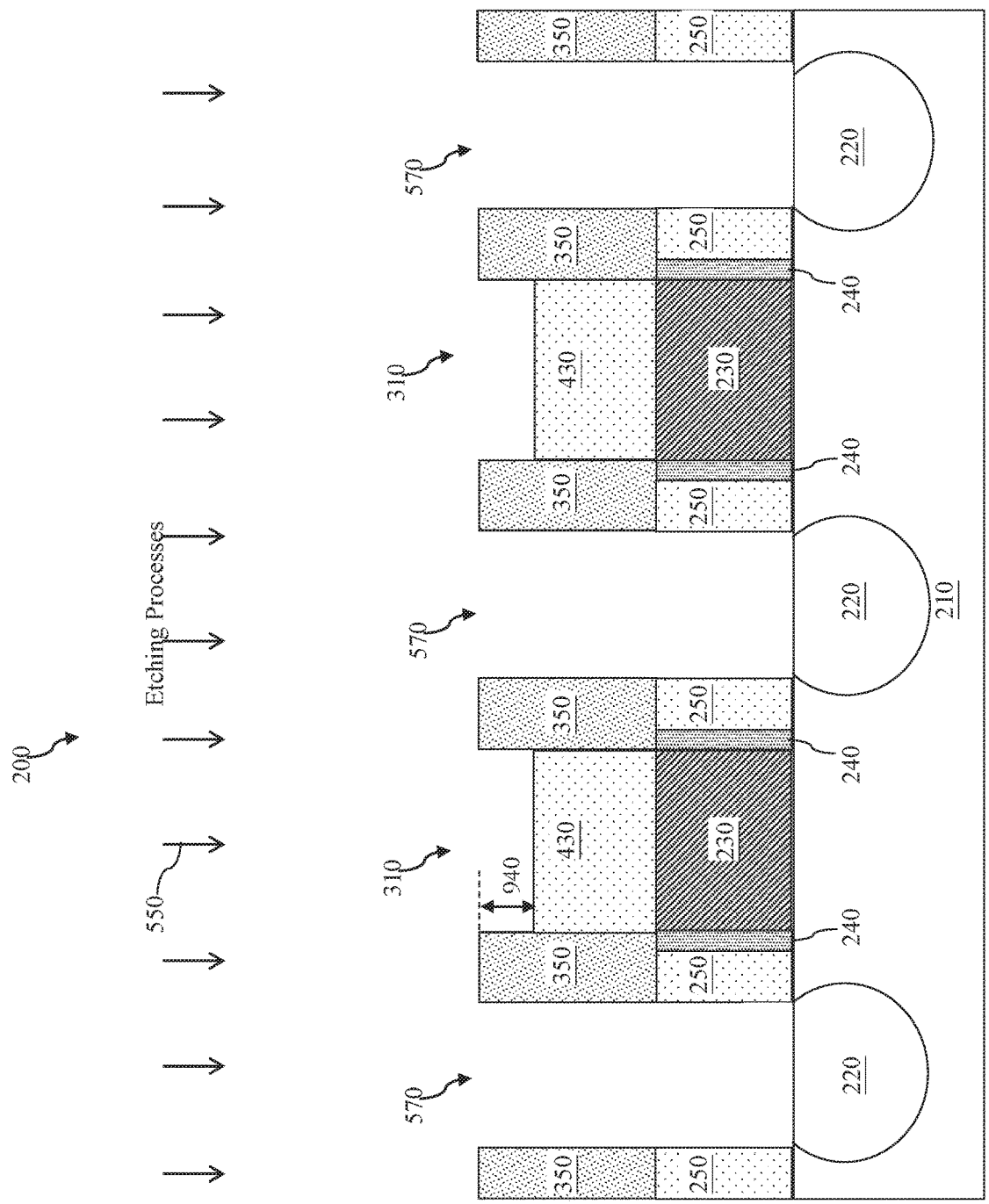

Referring now to FIG. 19, the one or more etching processes 550 discussed above with reference to FIG. 9 are performed to the semiconductor device 200. The one or more etching processes 550 etch away the dielectric layers 260 but not the mask layers 350 due to the etching selectivity between them. Thus, the mask layers 350 protect the layers 240-250 therebelow during the etching. The photoresist layers 910 also protect the dielectric materials 430 during the etching, and as such they serve as an etching mask, similar to the mask layers 350 in the first embodiment. The photoresist layers 910 may then be completely removed in a photoresist stripping or ashing process. The removal of the dielectric layers 260 forms the openings 570, which expose the source/drain regions 220.

Due to the differences in the fabrication processes being performed between the first embodiment and the second embodiment, the semiconductor device 200 has slightly different physical characteristics between the first and second embodiments. For example, as shown in FIG. 19, the mask layers 350 may be taller than the dielectric materials 430 by a height difference 940 in the second embodiment, whereas they have substantially similar heights in the first embodiment (see FIG. 9). In some embodiments, the height difference 940 is in a range between about 0.5 nm and about 20 nm.

Figure 20:
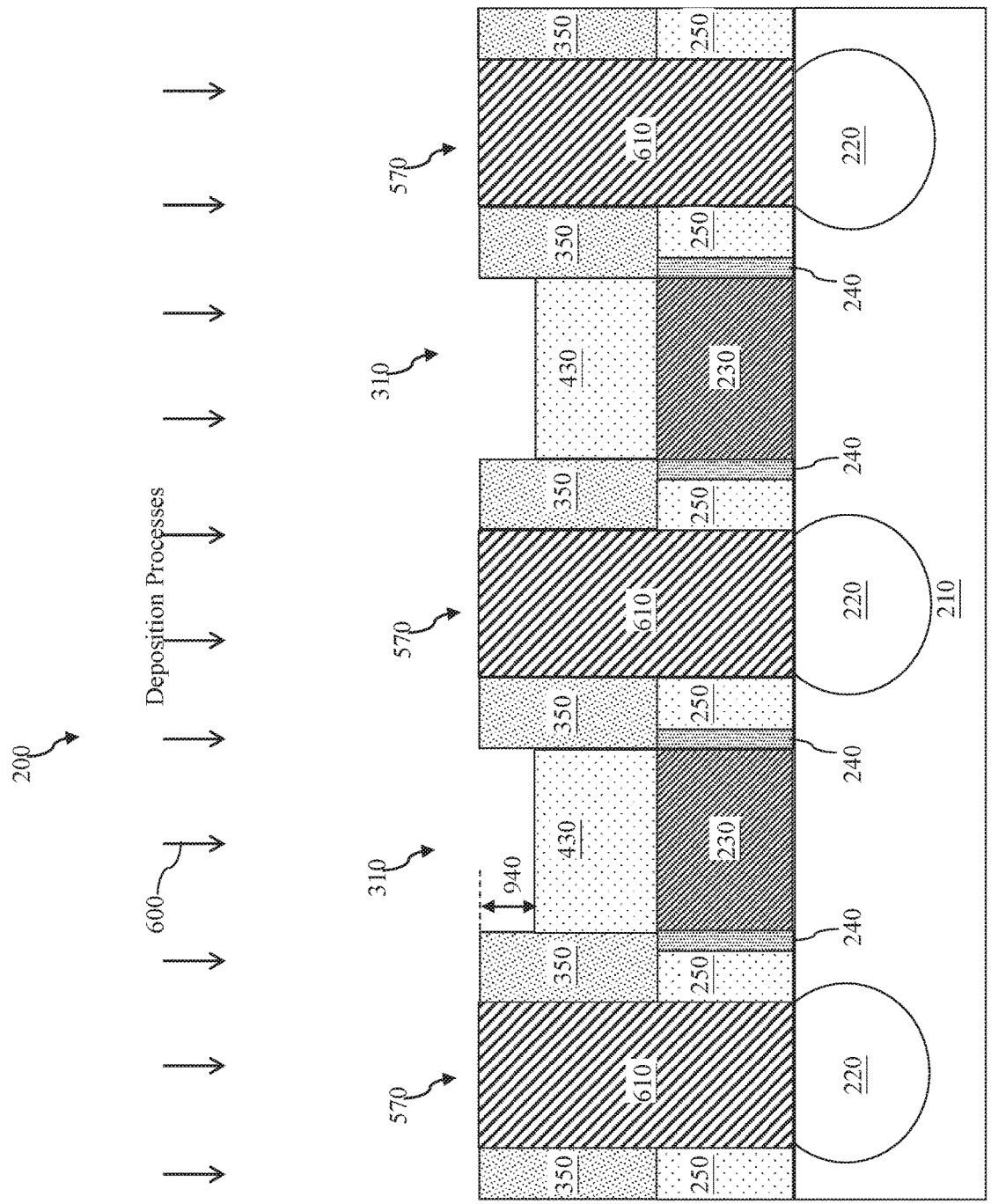

Referring now to FIG. 20, the one or more deposition processes 600 are performed to the semiconductor device 200. The one or more deposition processes 600 (followed by planarization processes) form the conductive contacts 610 in the openings 570. As discussed above, the conductive contacts 610 provide electrical connectivity to the source/drain regions 220. Note that due to the height difference 940, the conductive contacts 610 in the second embodiment shown in FIG. 20 may be slightly taller than the conductive contacts 610 in the first embodiment as shown in FIG. 10.

Figure 21:
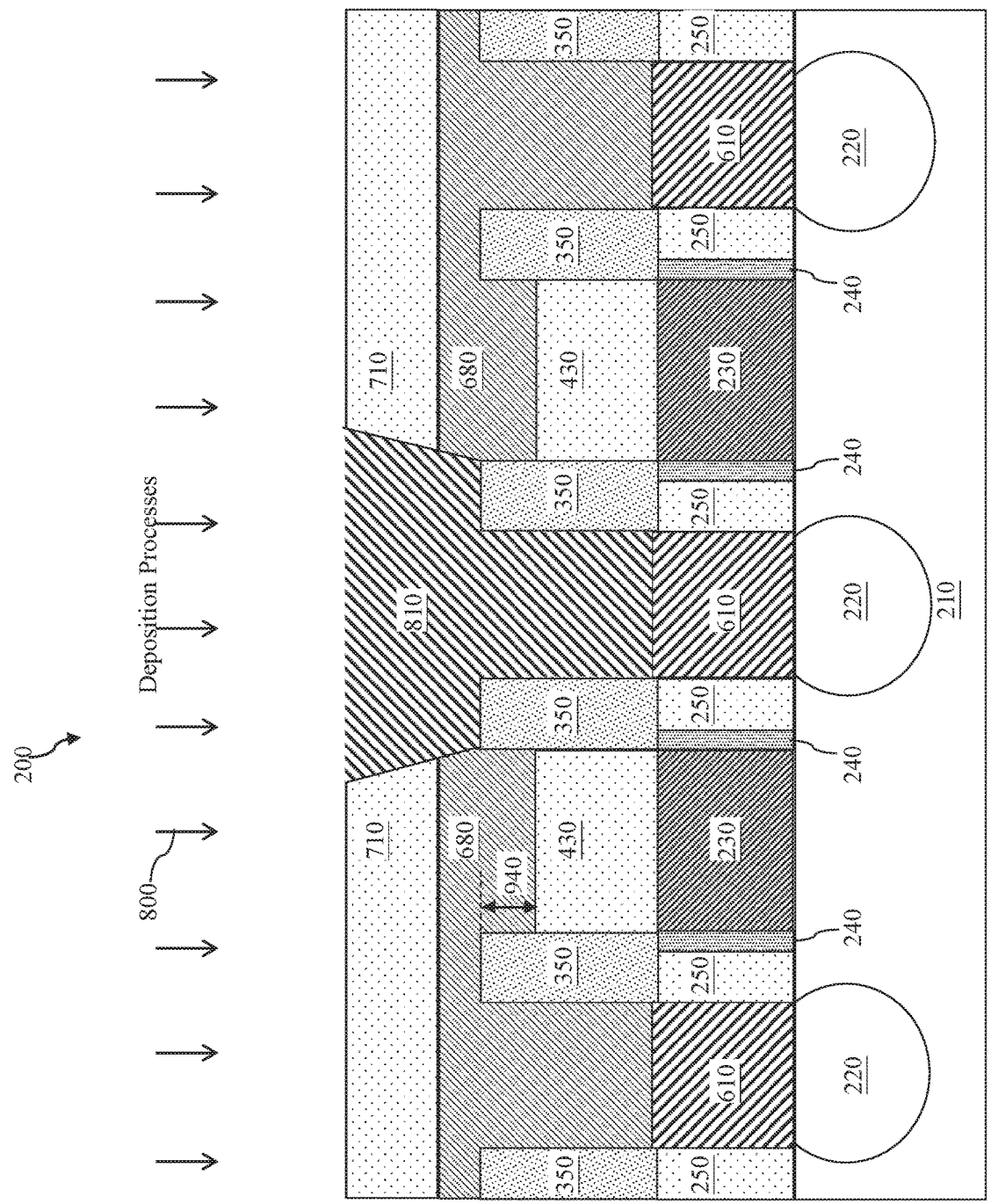
Figure 22:
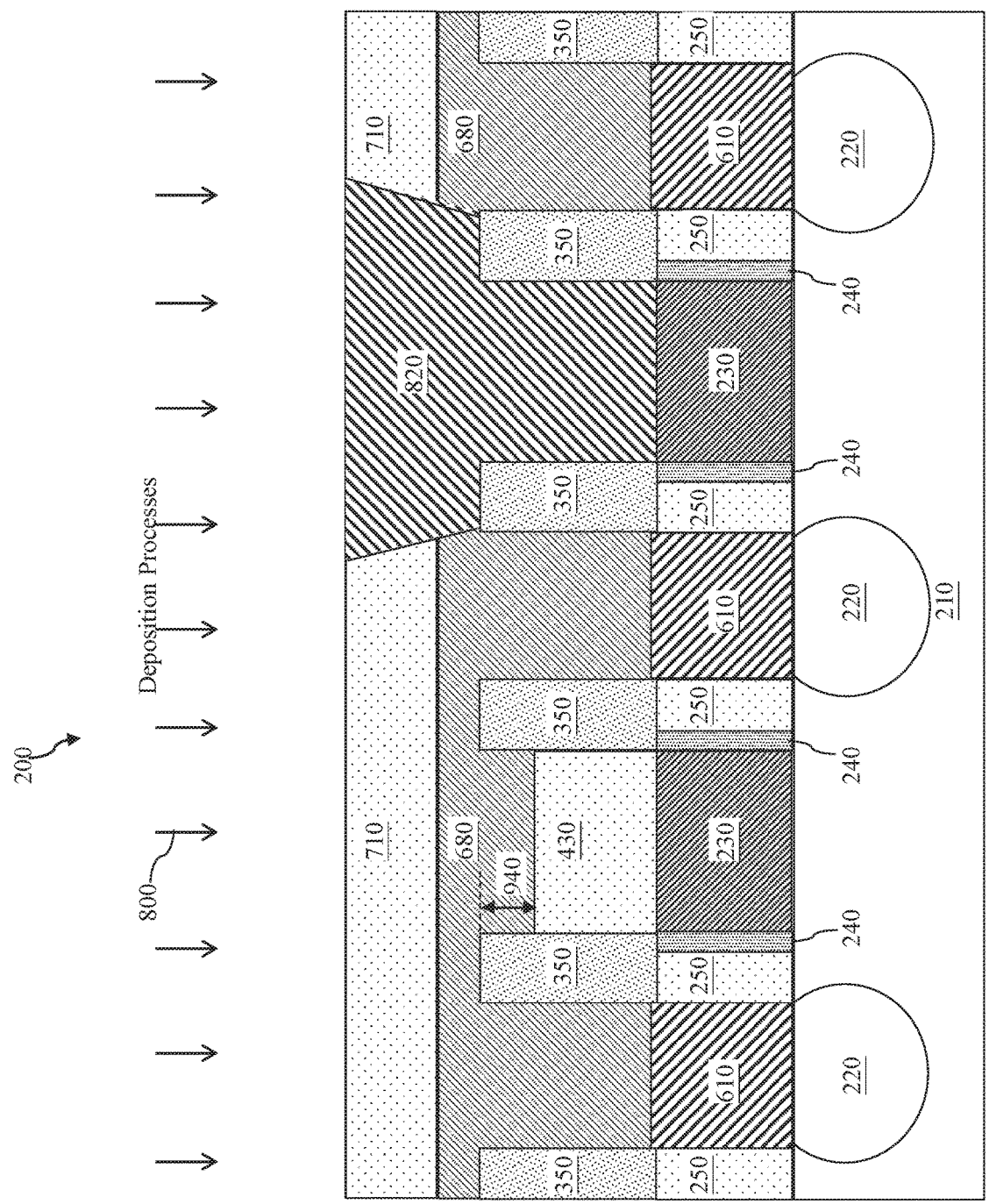

Thereafter, the processes 650, 670, 700, 750, and 800 discussed above with reference to FIGS. 11-17 are also performed to the semiconductor device 200 for the second embodiment. For reasons of simplicity, the discussion of these processes is not repeated herein. The resulting structures are shown in FIGS. 21-22, where the via 810 is formed over one of the conductive contacts 610 to provide electrical connectivity to the source/drain region 220 (see FIG. 21), and/or the via 820 is formed over one of the gate structures 230 to provide electrical connectivity to said gate structure 230 (see FIG. 22). Again, due to the differences in fabrication between the first embodiment and the second embodiment, the semiconductor device 200 in the second embodiment has taller mask layers 350. For example, a height difference 940 exists between the mask layers 350 and the dielectric materials 430.

FIGS. 23-29 illustrate a third embodiment of the present disclosure. For reasons of consistency and clarity, similar processes or components appearing in the first, second, and third embodiments are labeled the same.

Figure 23:
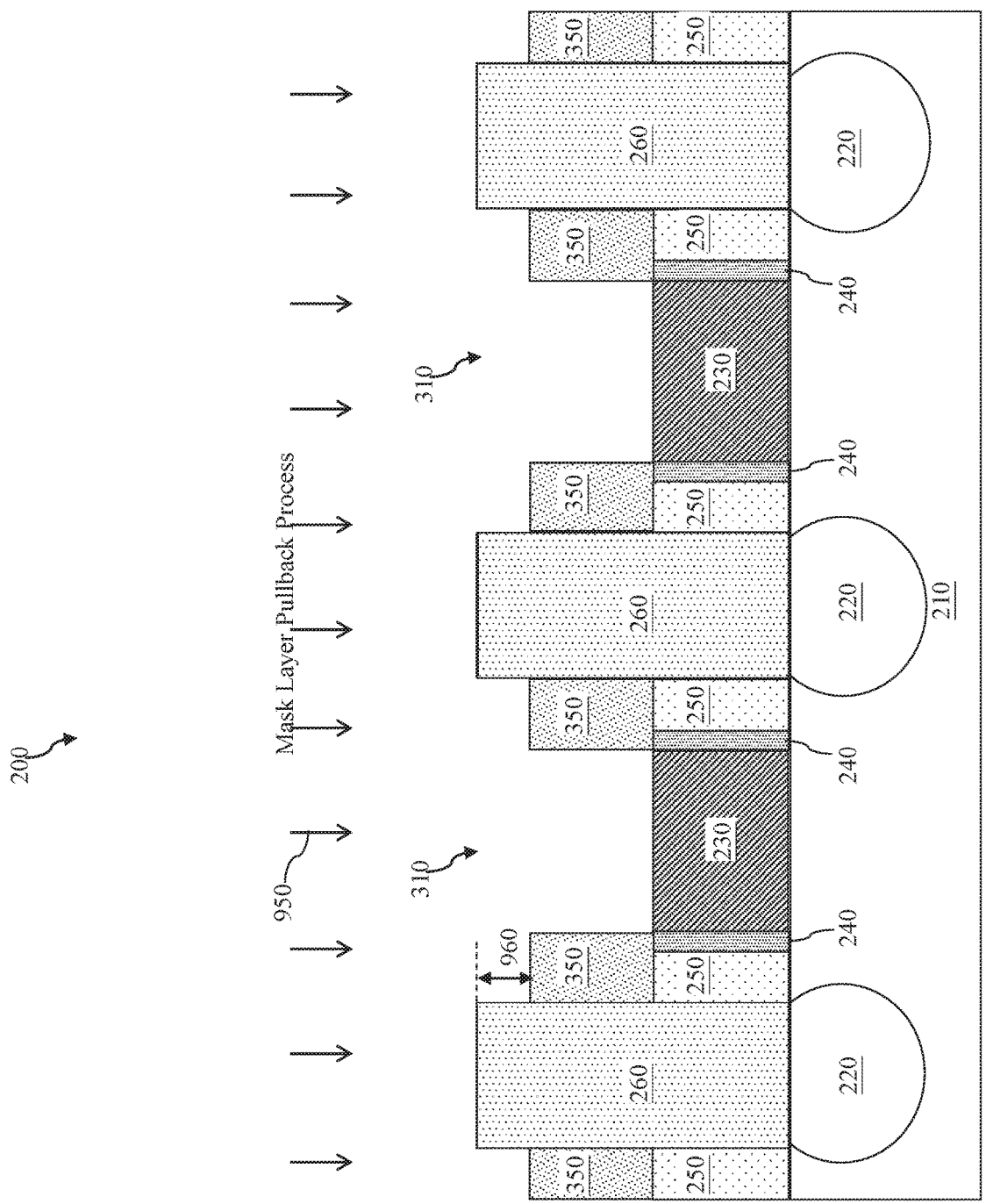

Referring now to FIG. 23, the semiconductor device 200 has undergone the same processing steps discussed above with reference to FIGS. 1-3. A mask layer pullback process 950 is then performed to the semiconductor device 200. The mask layer pullback process 950 is similar to the mask layer pullback process 400 discussed above with reference to FIG. 4, in that it also includes one or more etching processes to remove portions of the mask layer 350. However, the mask layer pullback process 400 removes a greater amount of the mask layer 350, such that the remaining segments of the mask layer 350 are now shorter than the dielectric layers 260. In other words, a distance 960 exists between the upper surfaces of the dielectric layers 260 and the upper surfaces of the remaining segments of the mask layer 350. In some embodiments, the distance 960 is in a range between about 0.5 nm and about 20 nm.

Figure 24:
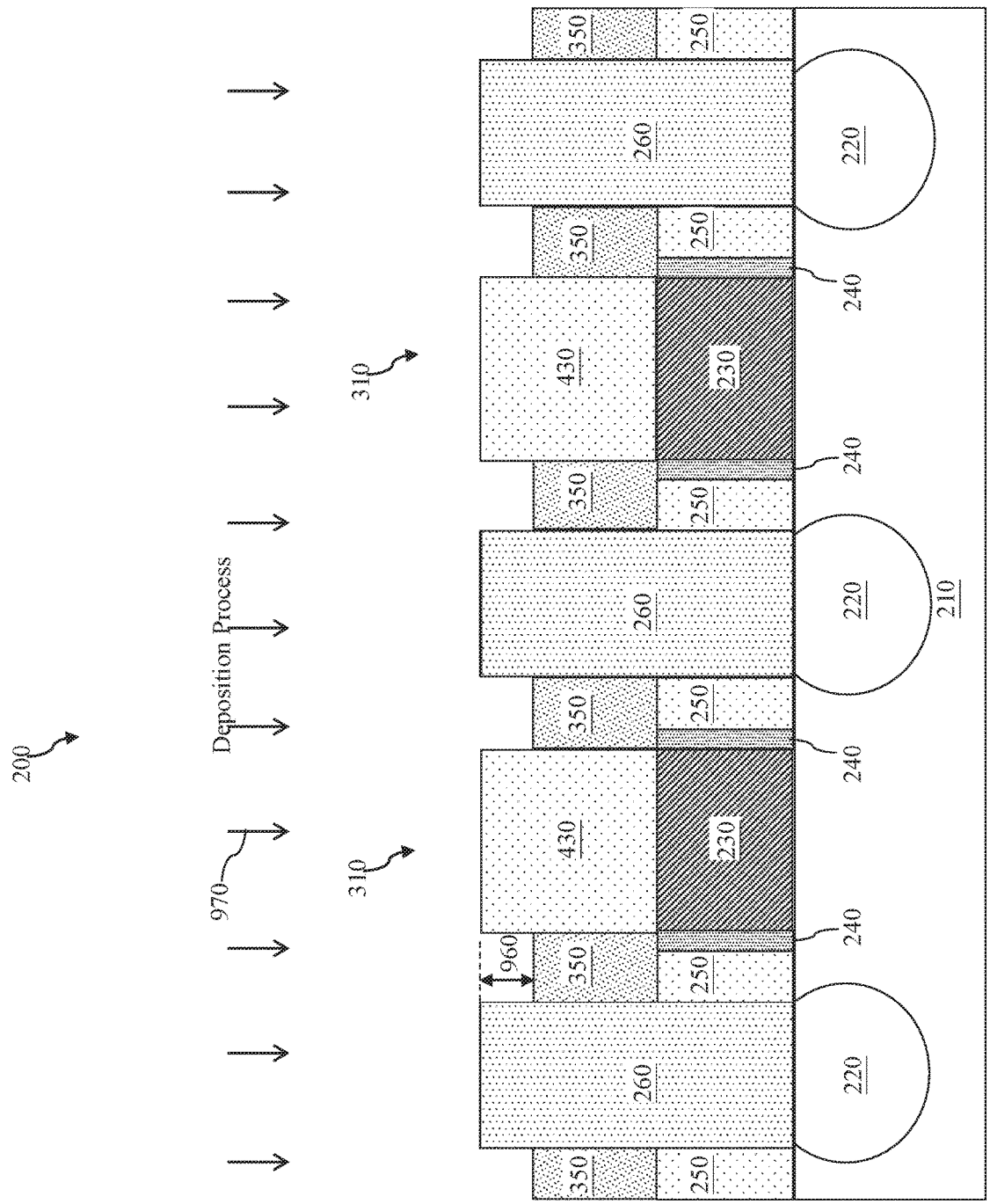

Referring now to FIG. 24, a deposition process 970 is performed to the semiconductor device 200. The deposition process 970 may be similar to the deposition process 420 discussed above with reference to FIG. 5 to form the dielectric materials 430. However, the deposition process 970 is performed such that the dielectric materials 430 not only completely fill the openings 310 but are also formed to be taller than the mask layers 350. For example, the upper surfaces of the dielectric materials 430 may be taller than the upper surfaces of the mask layers 350 by a distance substantially similar to the distance 960.

Figure 25:
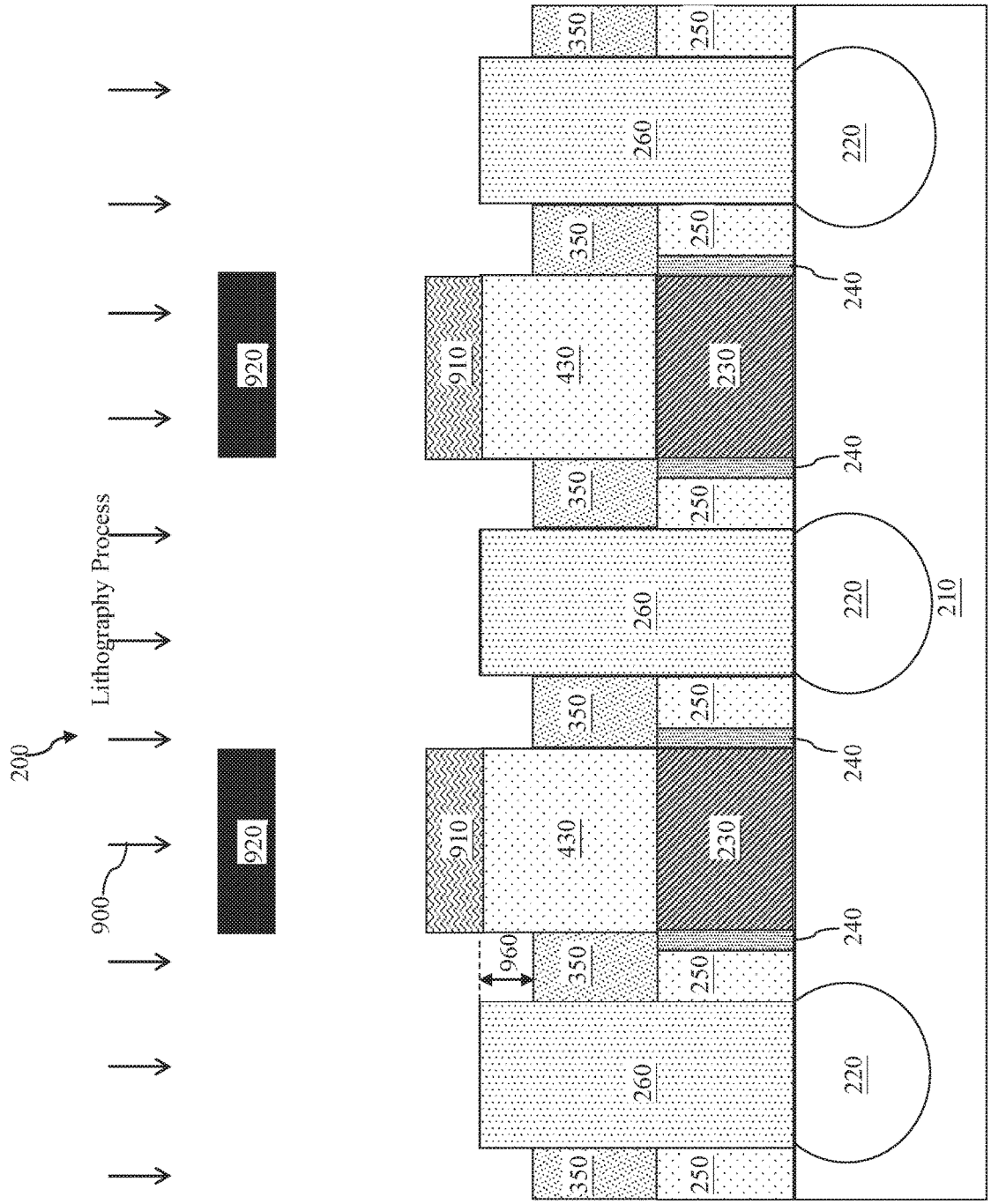

Referring now to FIG. 25, the lithography process 900 (discussed above with FIG. 18 according to the second embodiment) is performed to the semiconductor device 200. Similar to the second embodiment, photoresist layers 910 are formed (using reticles 920) to cover up the dielectric materials 430. The photoresist layers 910 will protect the dielectric materials 430 below in subsequent etching processes. Note that the photoresist layers 910 may be formed over the mask layers 350 in alternative embodiments as well, and this should not affect the intended fabrication processing, since the mask layer 350 is not meant to be etched away during the subsequent etching processes anyway.

Figure 26:
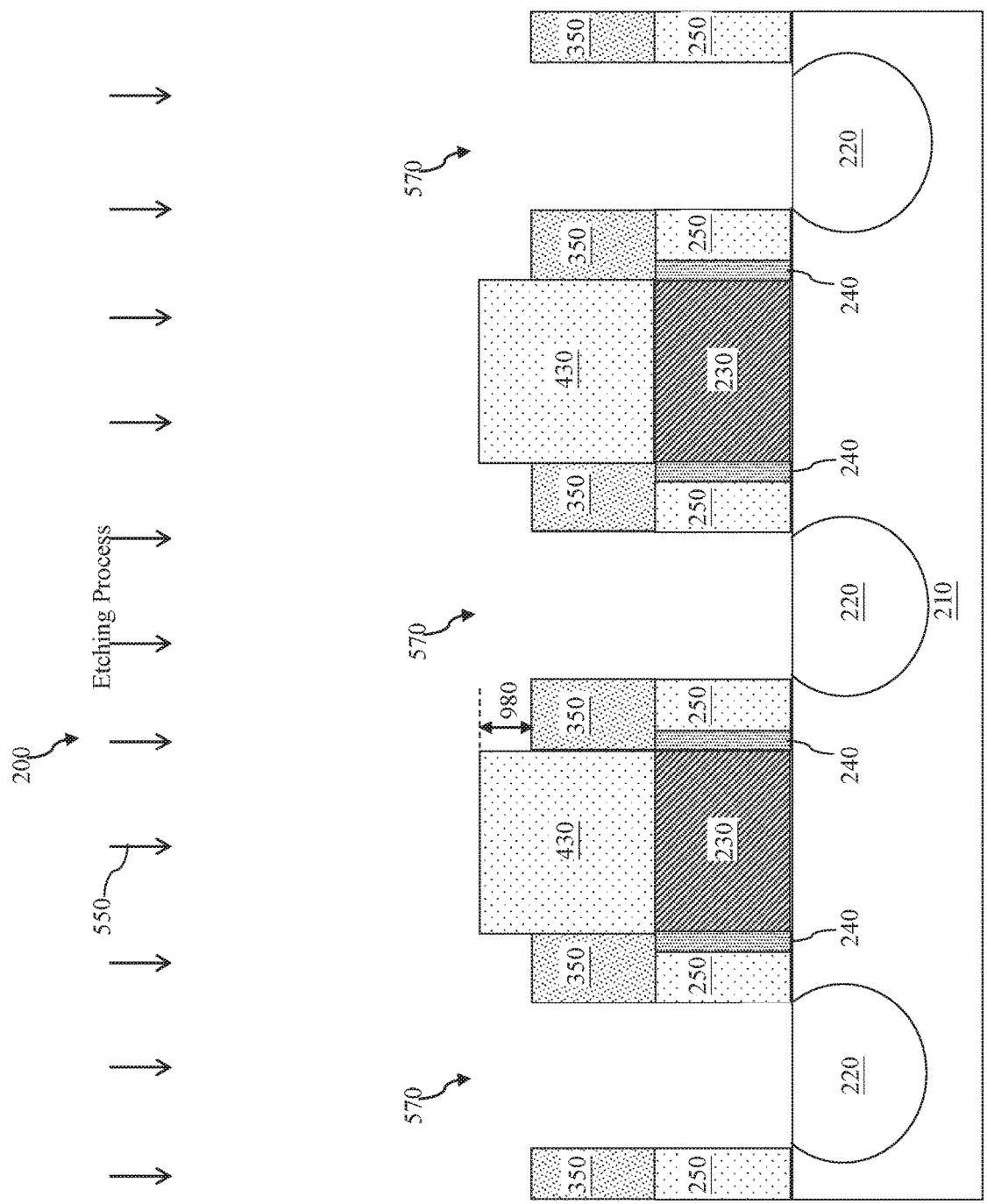

Referring now to FIG. 26, the one or more etching processes 550 discussed above with reference to FIG. 9 are performed to the semiconductor device 200. The one or more etching processes 550 etch away the dielectric layers 260 but not the mask layers 350 due to the etching selectivity between them. Thus, the mask layers 350 protect the layers 240-250 therebelow during the etching. The photoresist layers 910 also protect the dielectric materials 430 during the etching, and as such they serve as an etching mask, similar to the mask layers 350 in the first embodiment. The photoresist layers 910 may then be completely removed in a photoresist stripping or ashing process. The removal of the dielectric layers 260 forms the openings 570, which expose the source/drain regions 220.

Due to the differences in the fabrication processes being performed between the first embodiment and the third embodiment, the semiconductor device 200 has slightly different physical characteristics between the third embodiment and the first and second embodiments. For example, as shown in FIG. 26, the dielectric materials 430 may be taller than the mask layers 350 by a height difference 980 in the third embodiment, whereas they have substantially similar heights in the first embodiment (see FIG. 9), and the mask layers 350 may be taller than the dielectric materials 430 in the second embodiment (see FIG. 19). In some embodiments, the height difference 980 is in a range between about 0.5 nm and about 20 nm.

Figure 27:
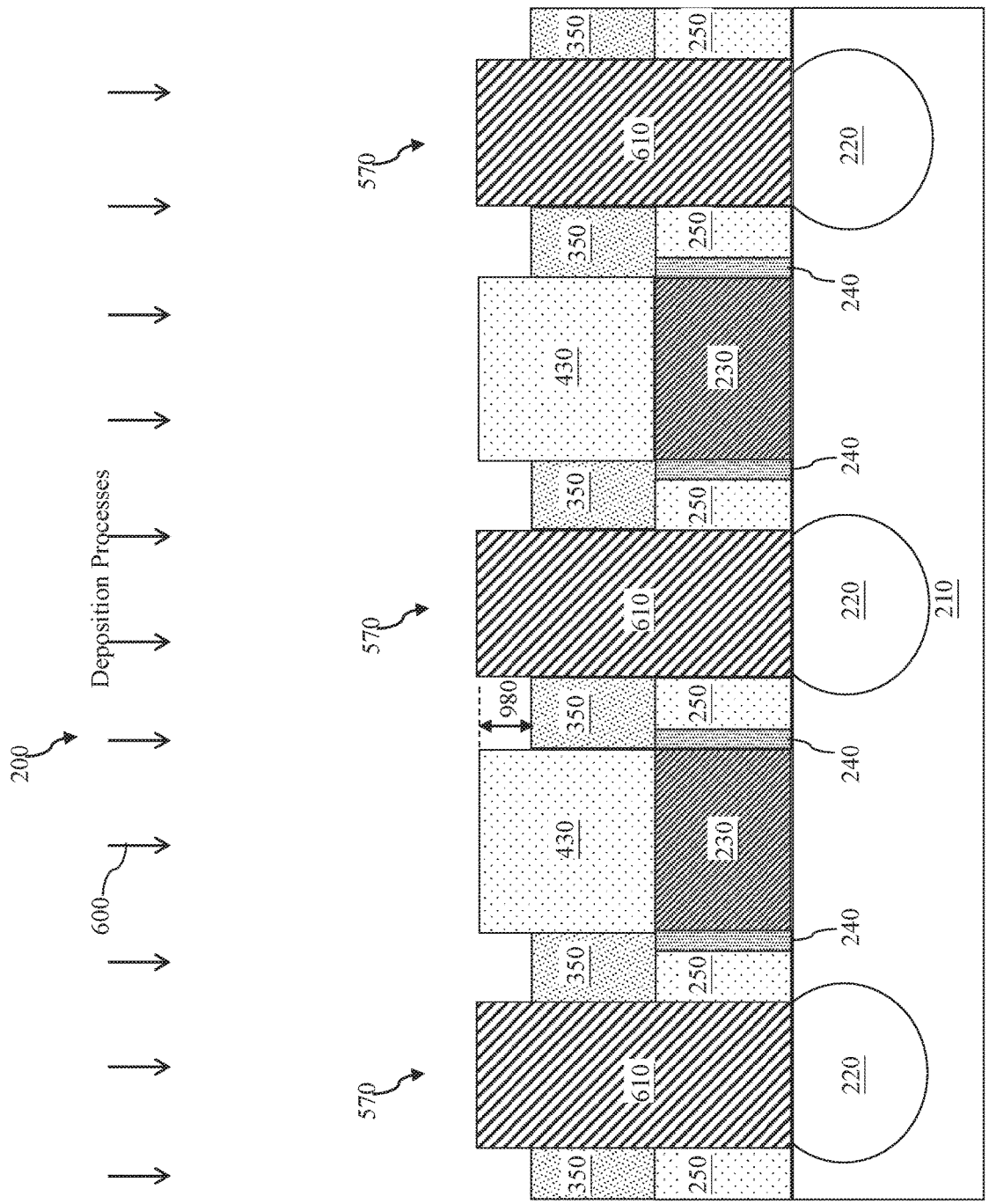

Referring now to FIG. 27, the one or more deposition processes 600 are performed to the semiconductor device 200. The one or more deposition processes 600 form the conductive contacts 610 in the openings 570. As discussed above, the conductive contacts 610 provide electrical connectivity to the source/drain regions 220. As is shown in FIG. 27, the mask layers 350 are shorter than both the dielectric materials 430 and the conductive contacts 610.

Figure 28:
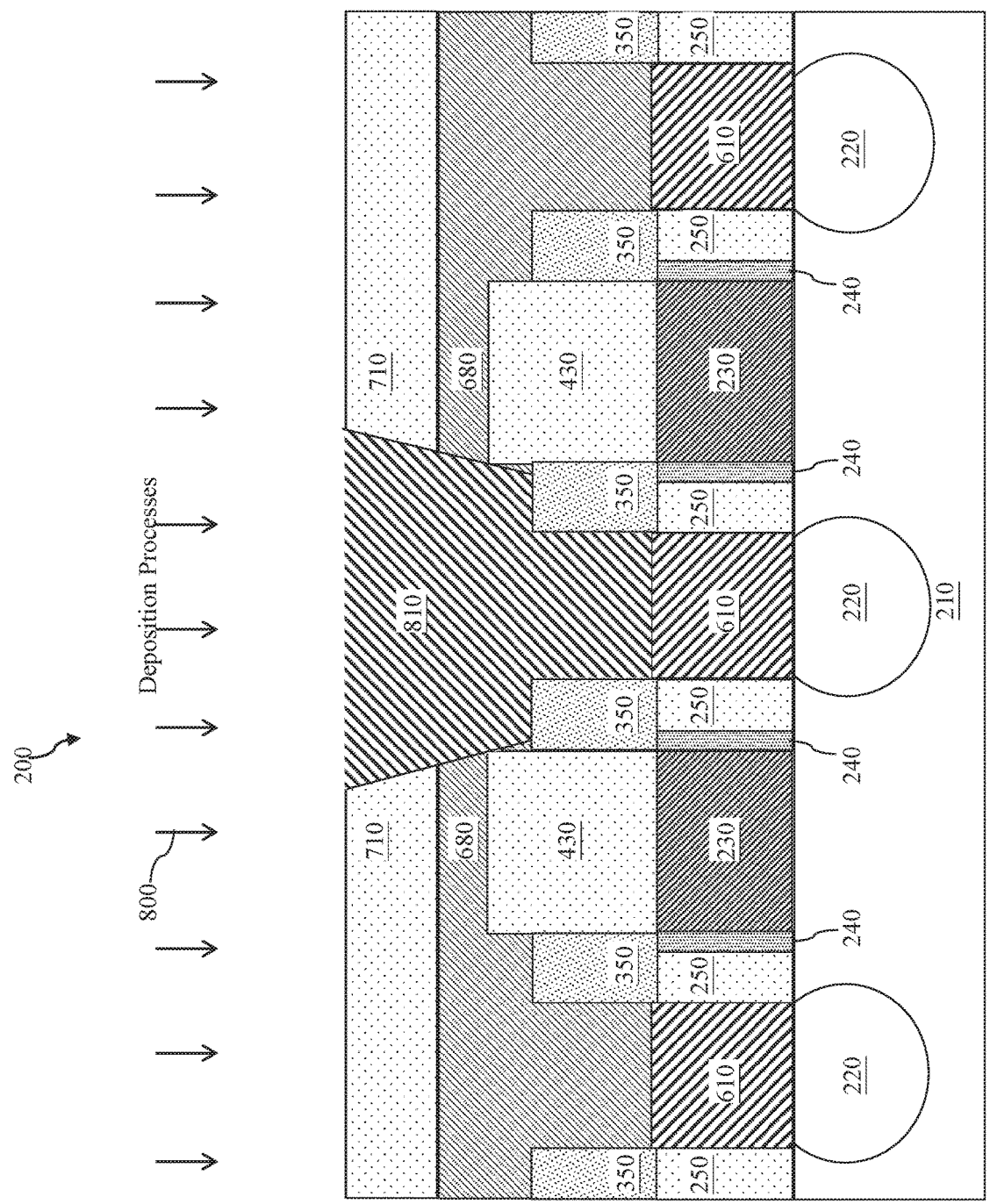
Figure 29:
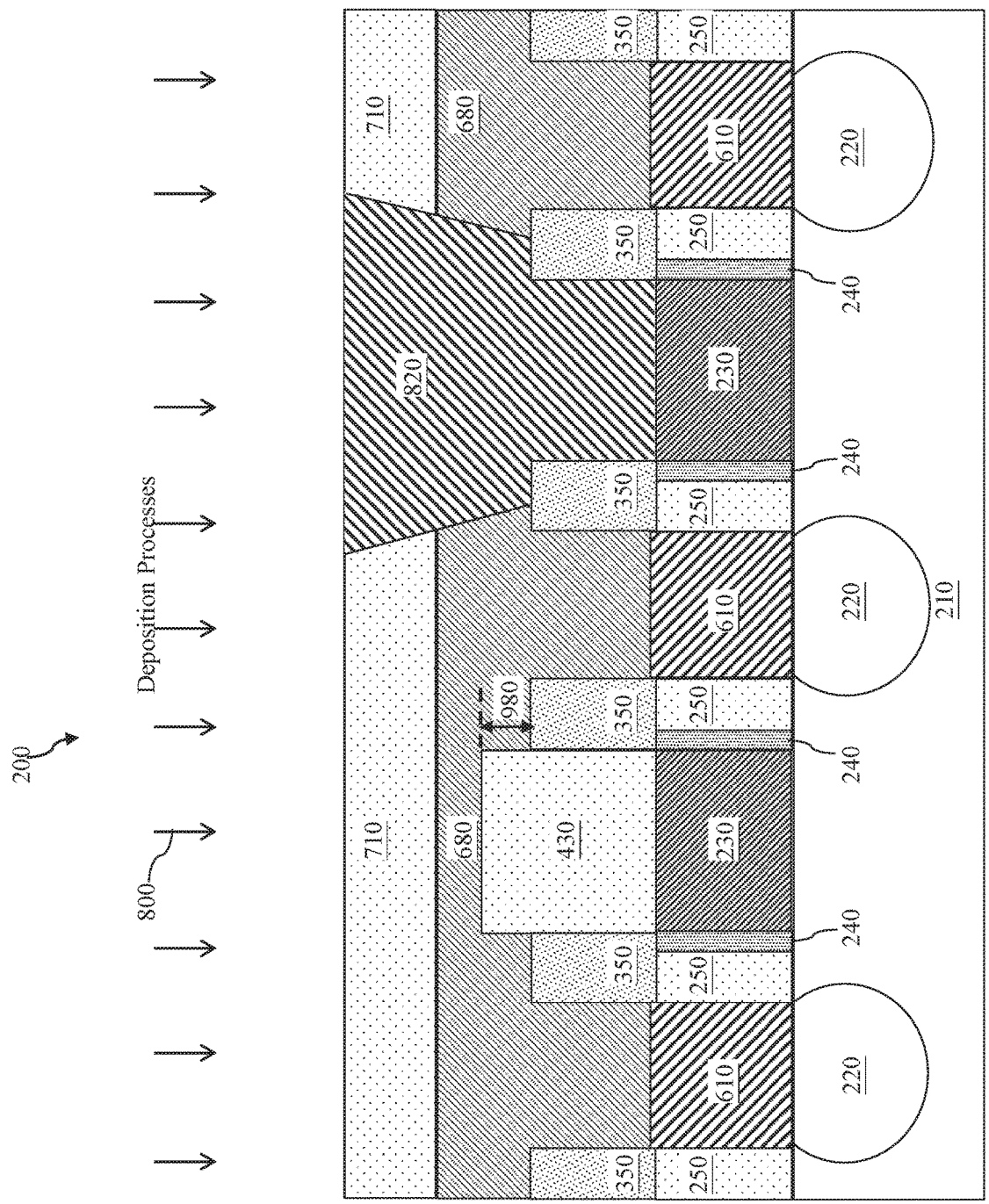

Thereafter, the processes 650, 670, 700, 750, and 800 discussed above with reference to FIGS. 11-17 are also performed to the semiconductor device 200 for the third embodiment. For reasons of simplicity, the discussion of these processes is not repeated herein. The resulting structures are shown in FIGS. 28-29, where the via 810 is formed over one of the conductive contacts 610 to provide electrical connectivity to the source/drain region 220 (FIG. 28), and/or the via 820 is formed over one of the gate structures 230 to provide electrical connectivity to said gate structure 230 (FIG. 29). Again, due to the differences in fabrication between the first embodiment and the third embodiment, the semiconductor device 200 in the third embodiment has taller dielectric materials 430 than the mask layers 350. For example, a height difference 980 exists between the mask layers 350 and the dielectric materials 430.

Although the fabrication steps in the second embodiment and the third embodiment differ from the first embodiment somewhat, they still achieve the same advantages of the first embodiment. For example, the mask layer 350 protects the gate spacers 240 and the etching-stop layers 250 from being etched, and they also prevent electrical leakage (e.g., undesirable electrical coupling) between the source/drain via 810 with the gate structures 230, or between the gate via/contact 820 with the source/drain conductive contacts 610. Overlay control may be loosened without risking excessive device failures. The relaxed overlay control may also lead to larger critical dimensions (e.g., larger via/contact sizes, or at least effective via/contact interface areas), which reduces electrical resistivity. In addition, the fact that the mask layers 350 have a high-k dielectric material should not significantly contribute to the overall parasitic capacitance, since they are located not directly on the sidewalls of the gate structures 230 but are above them. Furthermore, the present disclosure also achieves a lower intrinsic gate height and/or via/contact height compared to some conventional devices, since the present disclosure does not need an extra mask layer (e.g., an extra mask layer located between the etching-stop layer 680 and the gate structures 230) to pattern the vias/contacts.

The various embodiments of the present disclosure can be easily integrated into advanced technology nodes, including but not limited to the N20 (20-nanometer) node, the N216 (16-nanometer) node, the N10 (10-nanometer) node, the N7 (7-nanometer) node, or the N3 (3-nanometer) node, etc. It is also understood that the various aspects of the present disclosure may apply to traditional planar transistors as well as the more recently developed three-dimensional FinFET transistors. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety. For reasons of simplicity, the details of FinFET transistors are not specifically discussed herein.

Figure 30:
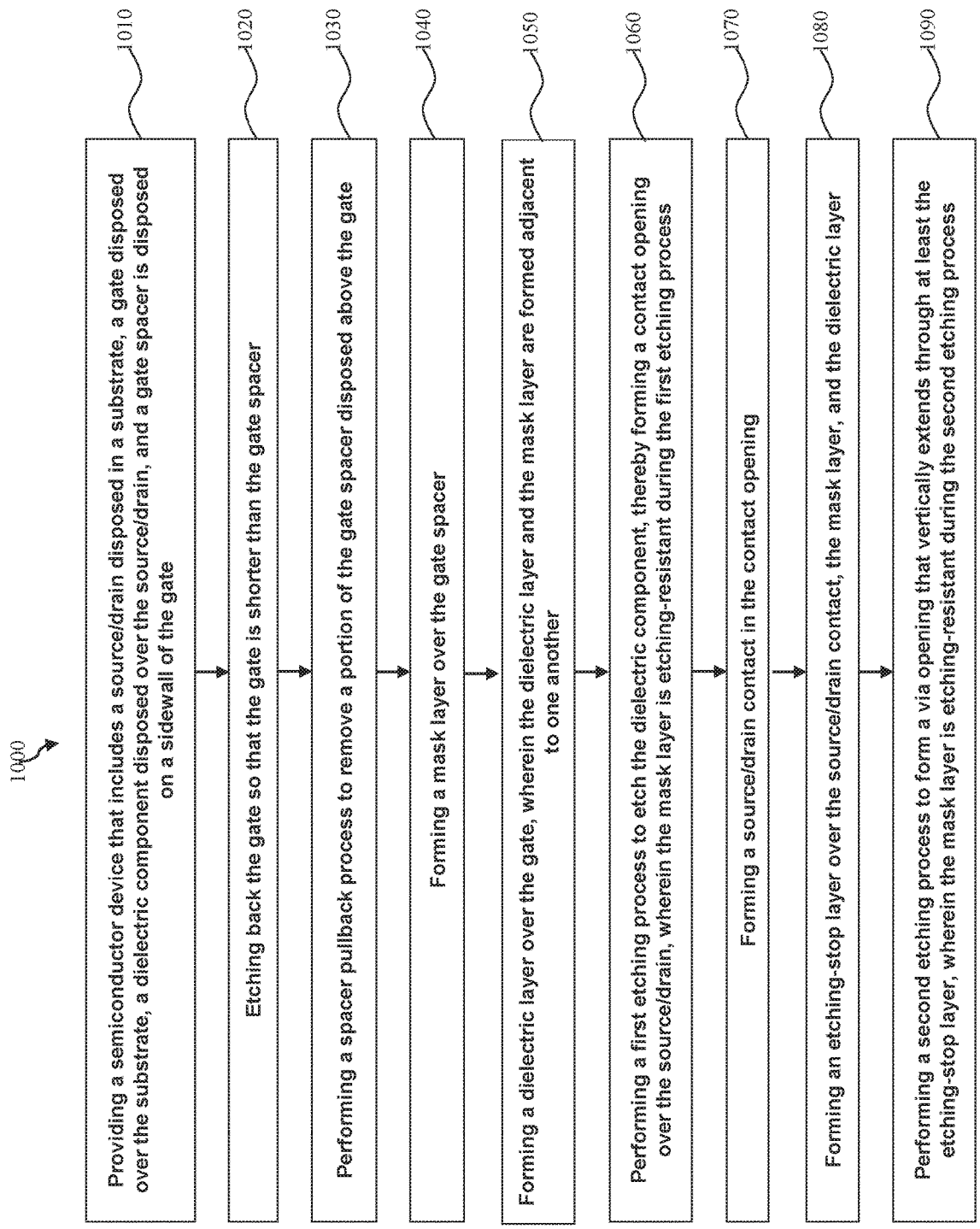
FIG. 30 is a flowchart illustrating a method of fabricating a semiconductor device according to an embodiment of the present disclosure.

FIG. 30 is a flowchart illustrating a method 1000 according to an embodiment of the present disclosure. The method 1000 includes a step 1010 of providing a semiconductor device that includes a source/drain disposed in a substrate, a gate disposed over the substrate, a dielectric component disposed over the source/drain, and a gate spacer is disposed on a sidewall of the gate.

The method 1000 includes a step 1020 of etching back the gate so that the gate is shorter than the gate spacer.

The method 1000 includes a step 1030 of performing a spacer pullback process to remove a portion of the gate spacer disposed above the gate.

The method 1000 includes a step 1040 of forming a mask layer over the gate spacer.

The method 1000 includes a step 1050 of forming a dielectric layer over the gate. The dielectric layer and the mask layer are formed adjacent to one another.

The method 1000 includes a step 1060 of performing a first etching process to etch the dielectric component, thereby forming a contact opening over the source/drain. The mask layer is etching-resistant during the first etching process.

The method 1000 includes a step 1070 of forming a source/drain contact in the contact opening.

The method 1000 includes a step 1080 of forming an etching-stop layer over the source/drain contact, the mask layer, and the dielectric layer.

The method 1000 includes a step 1090 of performing a second etching process to form a via opening that vertically extends through at least the etching-stop layer. The mask layer is etching-resistant during the second etching process.

In some embodiments, the second etching process forms a source/drain via opening that exposes the source/drain contact.

In some embodiments, the second etching process forms a gate via opening that vertically extends through the etching-stop layer and the dielectric layer, and wherein the gate via opening exposes the gate.

In some embodiments, the step 1040 of forming the mask layer comprises: depositing a high-k dielectric material as the mask layer, the deposited high-k dielectric material having an antenna-shaped cross-sectional profile; and etching the deposited high-k dielectric material into a plurality of segments, wherein the mask layer includes one of the segments.

In some embodiments, the step 1040 of forming the mask layer and the step 1050 of forming of the dielectric layer are performed such that the mask layer and the dielectric layer have substantially similar heights.

In some embodiments, the step 1040 of forming the mask layer and the step 1050 of forming of the dielectric layer are performed such that the mask layer is taller than the dielectric layer.

In some embodiments, the step 1040 of forming the mask layer and the step 1050 of forming of the dielectric layer are performed such that the mask layer is shorter than the dielectric layer.

In some embodiments, the step 1040 of forming the mask layer comprises forming the mask layer to have a ⊓-like cross-sectional profile before the first etching process is performed. The mask layer protects the dielectric layer from being damaged during the first etching process.

In some embodiments, the step 1050 of forming the dielectric layer comprises covering the dielectric layer with a photoresist material. The photoresist material protects the dielectric layer from being etched in the first etching process.

It is understood that additional processes may be performed before, during, or after the steps 1010-1090 of the method 1000. For example, after the via opening is formed by the second etching process in step 1090, a deposition process may be performed to fill the via opening with a conductive material, thereby forming a via. The method 1000 may further include steps such as forming additional metal layers, testing, packaging, etc. For reasons of simplicity, other additional steps are not discussed herein in detail.

In summary, the present disclosure utilizes unique fabrication process flows to form vias and/or conductive contacts for components of a semiconductor device. According to the unique fabrication process flows, an antenna-shaped mask layer (e.g., containing a high-k dielectric material) may be formed, which can be patterned into a ⊓-like shaped component in some embodiments to facilitate the etching of MD contact openings. For example, due to the etching selectivity provided by the ⊓-like shaped component, the MD contact openings can achieve self-alignment with the source/drain regions, and the gate spacers can be protected by the ⊓-like shaped component. The mask layer can also facilitate the etching of via openings, for example by helping the via openings achieve self-alignment, as well as by protecting low-k dielectric materials from being inadvertently etched. Other embodiments may not form the ⊓-like shaped component, but the same effects are achieved by using reticles to define photoresist layers.

As such, the present disclosure offers advantages over conventional devices. It is understood, however, that other embodiments may offer additional advantages, and not all advantages are necessarily disclosed herein, and that no particular advantage is required for all embodiments. One advantage is that the present disclosure prevents or reduces the electrical leakage risks. As semiconductor device feature sizes continue to shrink, poor overlay control could cause the via/contact intended for one component (e.g., gate) to be also formed on another component (e.g., source/drain), or vice versa. The present disclosure overcomes this problem using a mask layer to facilitate the self-alignment of the via/contacts, which helps to relax the overlay control. Another advantage is that the mask layer can protect the dielectric components below, for example the low-k gate spacers from being damaged during etching. Yet another advantage is that the fabrication process flows of the present disclosure will result in a shorter device with shorter via/contact heights compared to some conventional devices. The shorter device helps to lower electrical resistivity. One more advantage is that the present disclosure achieves larger contact surface areas, which again reduces electrical resistivity. A further advantage is that the present disclosure does not unduly increase parasitic capacitance even though the mask layer includes a high-k dielectric material, because the dielectric material is not located close enough to the gate to significantly raise the parasitic capacitance. Other advantages include compatibility with existing semiconductor device design and manufacture, so the present disclosure does not require additional processing and is therefore easy and cheap to implement.

One aspect of the present disclosure pertains to a semiconductor device. A source/drain region is disposed in a substrate. A gate structure is disposed over the substrate. A gate spacer is disposed on a sidewall of the gate structure. The gate spacer and the gate structure have substantially similar heights. A via is disposed over and electrically coupled to: the source/drain region or the gate structure. A mask layer is disposed over the gate spacer. The mask layer has a greater dielectric constant than the gate spacer. A first side of the mask layer is disposed adjacent to the via. A dielectric layer is disposed on a second side of the mask layer, wherein the mask layer is disposed between the dielectric layer and the via.

Another aspect of the present disclosure pertains to a semiconductor device. A source/drain region is located in a substrate. A source/drain contact is located on the source/drain region. A source/drain via is located over the source/drain contact. A metal gate is located over the substrate. A gate via is located on the metal gate. The source/drain via and the gate via have substantially similar heights. A gate spacer is located on a sidewall of the metal gate. A mask layer is located on the gate spacer. The mask layer has a greater dielectric constant than the gate spacer. The mask layer is located besides the source/drain via or the gate via.

Yet another aspect of the present disclosure involves a method of fabricating a semiconductor device. A semiconductor device is provided that includes a source/drain disposed in a substrate, a gate disposed over the substrate, a dielectric component disposed over the source/drain, and a gate spacer is disposed on a sidewall of the gate. The gate is etched back so that the gate is shorter than the gate spacer. A spacer pullback process is performed to remove a portion of the gate spacer disposed above the gate. A mask layer is formed over the gate spacer. A dielectric layer is formed over the gate. The dielectric layer and the mask layer are formed adjacent to one another. A first etching process is performed to etch the dielectric component, thereby forming a contact opening over the source/drain. The mask layer is etching-resistant during the first etching process. A source/drain contact is formed in the contact opening. An etching-stop layer is formed over the source/drain contact, the mask layer, and the dielectric layer. A second etching process is performed to form a via opening that vertically extends through at least the etching-stop layer. The mask layer is etching-resistant during the second etching process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a source/drain region disposed in a substrate;
a gate structure disposed over the substrate;
a gate spacer disposed on a sidewall of the gate structure, wherein the gate spacer and the gate structure have substantially similar heights;
a via disposed over and electrically coupled to: the source/drain region or the gate structure;
a mask layer disposed over the gate spacer, wherein the mask layer has a greater dielectric constant than the gate spacer, and wherein a first side of the mask layer is disposed adjacent to the via;
a dielectric layer disposed on a second side of the mask layer, wherein the mask layer is disposed between the dielectric layer and the via, and wherein a bottom surface of the mask layer is substantially co-planar with a bottom surface of the dielectric layer;
a first etching-stop layer disposed between the mask layer and the substrate; and
a second etching-stop layer disposed at least partially over the dielectric layer, wherein the second etching-stop layer is separated from the gate structure and the first etching-stop layer by at least the mask layer and the dielectric layer.

2. The semiconductor device of claim 1, wherein the via includes a gate via disposed over the gate structure.

3. The semiconductor device of claim 1, further comprising: a source/drain contact disposed over the source/drain region, wherein the via includes a source/drain via disposed over the source/drain contact.

4. The semiconductor device of claim 1, wherein the mask layer and the gate spacer have different material compositions.

5. The semiconductor device of claim 1, wherein the mask layer and the dielectric layer have different material compositions.

6. The semiconductor device of claim 1, wherein the dielectric layer has a dielectric constant lower than a dielectric constant of silicon oxide.

7. The semiconductor device of claim 1, wherein a side surface of the second etching-stop layer is in direct physical contact with the via.

8. The semiconductor device of claim 1, wherein a side surface of the mask layer is in direct contact with a sidewall of a lower portion of the via, and wherein an upper surface of the mask layer is in direct contact with an upper portion of the via.

9. The semiconductor device of claim 1, further comprising: an interlayer dielectric (ILD) disposed over the dielectric layer, wherein the via vertically extends through at least the ILD.

10. A semiconductor device, comprising:
a plurality of source/drain regions located in a substrate;
a plurality of source/drain contacts located on the source/drain regions, respectively, wherein the source/drain contacts include a first source/drain contact and a second source/drain contact;
a source/drain via located over the first source/drain contact;
a metal gate located over the substrate;
a gate via located on the metal gate, wherein the source/drain via and the gate via have substantially similar heights;
a gate spacer located on a sidewall of the metal gate;
a first etching-stop layer disposed over the substrate, wherein the first etching-stop layer and the gate spacer have substantially co-planar upper surfaces;
a second etching-stop layer disposed over the first etching-stop layer, wherein the second etching-stop layer includes a first portion disposed over the second source/drain contact and a second portion that protrudes laterally from the first portion; and
a mask layer located on the gate spacer, wherein the mask layer has a greater dielectric constant than the gate spacer, and wherein the mask layer is located besides the source/drain via or the gate via.

11. The semiconductor device of claim 10, wherein an upper surface of the gate spacer is substantially co-planar with an upper surface of the metal gate.

12. The semiconductor device of claim 10, wherein the source/drain via is in direct contact with a side surface and a top surface of at least a portion of the mask layer.

13. The semiconductor device of claim 10, further comprising a dielectric component disposed over the metal gate and adjacent to the mask layer.

14. The semiconductor device of claim 13, wherein the mask layer and the dielectric component have different material compositions.

15. The semiconductor device of claim 10, wherein the source/drain via is in direct physical contact with the mask layer.

16. The semiconductor device of claim 15, wherein the source/drain via includes an upper portion disposed over a lower portion, and wherein the lower portion, but not the upper portion, is in direct physical contact with the mask layer.

17. The semiconductor device of claim 16, further comprising:
an interlayer dielectric (ILD) disposed over the second etching-stop layer; and
wherein the second etching-stop layer and the ILD are in direct physical contact with the upper portion of the via but not with the lower portion of the via.

18. A semiconductor device, comprising:
a source/drain region formed in a substrate;
a source/drain contact formed over the source/drain region;
a source/drain via formed over the source/drain contact;
a first gate and a second gate formed over the substrate;
a gate via formed over the first gate;
a gate spacer formed on a sidewall of the first gate;
a first etching-stop layer formed between the gate spacer and the source/drain contact;
a mask layer formed over both the gate spacer and the first etching-stop layer, wherein the mask layer and the gate spacer have different dielectric constants, and wherein a portion of the mask layer is in direct physical contact with the source/drain via;
a dielectric layer formed over the second gate and, wherein a side surface of the mask layer is in direct contact with a side surface of the dielectric layer, and wherein the mask layer and the dielectric layer have substantially co-planar bottom surfaces;
a second etching-stop layer disposed over at least a portion of the dielectric layer and at least a portion of the mask layer; and
an interlayer dielectric (ILD) disposed over the second etching-stop layer, wherein the mask layer, the second etching-stop layer, and the ILD collectively surround the gate via laterally.

19. The semiconductor device of claim 18, wherein the source/drain via and the gate via have substantially co-planar upper surfaces.

20. The semiconductor device of claim 18, wherein both a top surface and a sidewall of the mask layer is in direct physical contact with the source/drain via.

* * * * *